United States Patent [19]
Iwahashi

[11] Patent Number: 5,477,500
[45] Date of Patent: Dec. 19, 1995

[54] DECODE CIRCUIT FOR A SEMICONDUCTOR MEMORY DEVICE

[75] Inventor: Hiroshi Iwahashi, Yokohama, Japan

[73] Assignee: Kabushiki Kaisha Toshiba, Kanagawa, Japan

[21] Appl. No.: 234,479

[22] Filed: Apr. 28, 1994

[30] Foreign Application Priority Data

Apr. 28, 1993 [JP] Japan ................................ 5-125064

[51] Int. Cl.$^6$ ............................................. G11C 17/00
[52] U.S. Cl. ............................. 365/230.06; 365/230.03; 365/185.11
[58] Field of Search ........................... 365/230.03, 185, 365/230.06, 184, 189, 104, 189.01

[56] References Cited

U.S. PATENT DOCUMENTS

| | | | |
|---|---|---|---|
| 5,008,856 | 4/1991 | Iwahashi | 365/185 |
| 5,043,942 | 8/1991 | Iwata et al. | 365/230.03 |
| 5,297,084 | 3/1994 | Ban | 365/230.06 |

FOREIGN PATENT DOCUMENTS

| | | |
|---|---|---|
| 63-175296 | 7/1988 | Japan . |
| 388200 | 4/1991 | Japan . |

Primary Examiner—David C. Nelms
Assistant Examiner—Vu A. Le
Attorney, Agent, or Firm—Spensley Horn Jubas & Lubitz

[57] ABSTRACT

A semiconductor memory device, comprising: first row lines; selecting transistors driven by the first row lines; second row lines; memory cells driven by the second row lines and connected in series with the selecting transistors; first selecting means for selecting the first row lines; second selecting means for selecting the second row lines; column lines connected to the selecting transistors; data detecting means connected to the column lines, for detecting data stored in the memory cells; first switching means connected between the first selecting means and the second row lines, for selecting the second row lines in response to the second selecting means; and second switching means connected between a potential supply terminal for supplying a predetermined potential and the second row lines, for selecting the second row lines in response to the second selecting means.

9 Claims, 20 Drawing Sheets

DISTRIBUTION OF THRESHOLD VOLTAGE OF MEMORY CELLS

DECODE CIRCUIT FOR A SEMICONDUCTOR MEMORY DEVICE

FIELD OF THE INVENTION

The present invention relates to a semiconductor memory device, and more specifically to a semiconductor memory device suitable for accessing memory cells arranged into a matrix pattern at high speed.

BACKGROUND OF THE INVENTION

The semiconductor integrated circuits have been microminiaturized more and more with increasing integration rate. Further, in MOS type integrated circuits, the thickness of the gate insulating film has been reduced more and more.

When the gate insulating film becomes thin, an electric field applied to the gate insulating film increases, and hence there arises the possibility that the gate will be easily damaged.

For this reason there has recently been developed a semiconductor integrated circuit such that a voltage (e.g., 5 V) supplied from the outside of the integrated circuit is deboosted to a lower voltage (e.g., 3 V) inside the integrated circuit, so that the deboosted voltage can be used as a power source voltage of an internal circuit of the integrated circuit.

Further, from the standpoint of less electricity consumption in integrated circuits, there has been developed a semiconductor memory device or a CPU in which the supply voltage of the integrated circuit itself is set at 3 V and the entire operation thereof is assured at this low voltage of 3 V.

Under such circumstances, a demand for semiconductor memory devices operated at 3 V has become strong in recent years, and such types of products are increasing gradually.

However, in the case of a non-volatile semiconductor memory device which comprises floating gate type MOS transistors as memory cells, it is difficult to reduce the operating voltage down to 3 V, since the threshold voltage of the memory cell is high.

FIG. 16 is a cross-sectional view showing a MOS transistor of floating gate structure. As is shown in FIG. 16, on P-type semiconductor substrate 131, drain 132 of an $N^+$ diffusion region and source 133 of an $N^+$ diffusion region are formed with channel region 134 interposed therebetween. Over channel region 134, floating gate 135 is disposed with first insulating film 137 interposed therebetween. Further, over the floating gate 135, control gate 136 is disposed with second insulating film 138 interposed therebetween.

In the construction as described above, since the first insulating film 137 is interposed between the floating gate 135 and the channel region 134, and the second insulating film 138 is interposed between the floating gate 135 and the control gate 136, a potential of the floating gate is increased when a potential is applied to the control gate 136. The channel region 134 can be controlled by the potential of the floating gate. The apparent thickness of the gate insulating film when seen from the control gate 136 to the channel region 134 is relatively thick because of the presence of both the first and second insulating films 137 and 138, with the result that the apparent threshold voltage increases when seen from the control gate 136.

Further, in the case of the NAND type EEPROM, for instance, a logic "1" or a logic "0" is stored in the memory cells in correspondence to the positive or negative threshold voltage of the memory cell. In other words, when electrons are injected into the floating gate 135, the positive threshold voltage can be obtained; and when electrons are emitted from the floating gate 135, the negative threshold voltage can be obtained. The electrons are injected from the substrate 131 to the floating gate 135 and emitted from the floating gate 135 to the substrate 131 through the first insulating film 137 by using a tunnel effect. Consequently, the threshold voltages of memory cells distribute usually within a range due to dispersion in thickness of the gate insulating film and subtle variations in the quality of the gate insulating film and a manufacturing process. FIG. 17 is a graphical representation showing the distribution of the threshold voltages of the memory cells, in which the number of memory cells is taken on the ordinate and the threshold voltage is taken on the abscissa. FIG. 17 indicates that the positive threshold voltages distribute within a range between two threshold voltages Vth1 and Vth2.

In the NAND type EEPROM, when data are read from the memory cells, the control gates 136 of the selected memory cells are set to a logic "0" and the control gates 136 of the non-selected memory cells are set to a logic "1". The memory cells of the negative threshold voltage are turned on when the control gates 136 are a logic "0", and the memory cells of the positive threshold voltage are turned off when the control gates 136 are a logic "0". The data stored in the memory cells are read on the basis of whether the selected memory cells are turned on or off.

On the other hand, the control gates 136 of the non-selected memory cells are set to a logic "1", so that the non-selected memory cells are turned on irrespective of the positive and negative threshold voltages thereof.

FIG. 18 shows an example of the circuit configuration of the NAND type EEPROM memory cells. The memory cell block 127 is constructed by connecting memory cells 31 to 34 in series between select transistor 4 and current cut-off transistor 1. In these memory cells 31 to 34, the gates of the non-selected memory cells are set to a logic "1" (a turn-on state) and the gates of the selected memory cells are set to a logic "1" (a turn-off state). Under these conditions, data stored in the selected memory cells can be read on the basis of whether the selected memory cells are turned on or off; that is, whether current flows through the series-connected memory cells 31 to 34.

However, as shown in FIG. 17, in order to turn on all the non-selected memory cells, it is necessary to apply a voltage, which is higher than the threshold voltage Vth2 of FIG. 17, to the control gate of the non-selected memory cells. If a larger current flows through the memory cells, it is possible to increase the data read speed of the semiconductor memory.

As already explained, the threshold voltages of the memory cells disperse within a range. In usual, this range (Vth2–Vth1) lies between 1 and 2 V. When a data is read from the memory cell, data of a logic "1" is generally supplied from a voltage supply terminal to the control gate of the memory cell via a row line. When the supply voltage from the voltage supply terminal is reduced, since the difference between the threshold voltage Vth2 and the supply voltage becomes small, the current of the memory cell is reduced. Consequently, the data read speed is delayed.

In contrast with this, in order to increase the difference between the threshold voltage Vth2 and the supply voltage, the threshold voltage Vth2 must be low. In this case, however, it is necessary to retain the threshold voltage Vth1 at the positive value. In other words, in order to reduce the threshold voltage Vth2 under the condition that the threshold voltage Vth1 is kept at the positive value, it is necessary to reduce the dispersion range (Vth2–Vth1) of the threshold voltage. However, this is rather difficult from the standpoint of the manufacturing process technique.

Instead of the above-mentioned method, for instance it is also possible to consider that the supply voltage is boosted inside the integrated circuit and then the boosted voltage is applied to the control gates of the non-selected memory cells. In this case, however, since the booster circuit is usually small in the current supply capability, there exists such a drawback that it takes a long time to charge the row lines.

FIG. 19 is a block diagram showing the relationship between the memory cell array and the row decoder of a NAND type EEPROM. As shown in FIG. 19, the gate of the select transistor 4, the gate of the current cut-off transistor 1, and the gates of the memory cells 31, 32, 33, . . . are connected to row line W. Between column line 128 and a reference potential, memory cell block 127; that is, a series-connected circuit composed of select transistor 4, the memory cells 31, 32, 33, . . . , and current cut-off transistor 1 is connected. Further, a plurality of the memory cell blocks 127 are arranged into a matrix array. One end of the select transistor 4; that is, one end of the memory cell block 127 is connected to column line 128 for each corresponding column. The column line 128 is connected to a detecting circuit (not shown) to read data from the memory cells selected by the row decoder 139.

FIG. 20 shows a part of FIG. 19 in more detail manner, in which the number of the memory cells in each memory cell block 127 is four.

As shown in FIG. 20, signal B1 of the row decoder 139 is given to the gates of P-channel transistors 51 to 54 and further to the gates of N-channel transistors 61 to 64 via an inverter I1 as signal /B1. On the other hand, signals S1 to S4 are supplied to the sources of transistors 51, 61; 52, 62; 53, 63; and 54, 64, respectively. The drains of the transistors 51 and 61 are connected to the gate of the memory cell 31 via a row line W11; the drains of the transistors 52 and 62 are connected to the gate of the memory cell 32 via a row line W12; the drains of the transistors 53 and 63 are connected to the gate of the memory cell 33 via a row line W13; and the drains of the transistors 54 and 64 are connected to the gate of the memory cell 34 via a row line W14. The row lines W11 to W14 are connected to a reference potential through the transistors 6 to 9. The signal B1 is supplied to the gates of the transistors 6 to 9, respectively. The signal /B is supplied to the select transistor 4 of the memory cell block 127 (1), and signal φ is supplied to the current cut-off transistor 1.

In FIG. 20, transistors 6 to 9 are N-channel type MOS transistors.

In the same way, as shown in FIG. 20, a signal B2 of the row decoder 139 is given to the gates of transistors 51 to 54 and further to the gates of transistors 61 to 64 via an inverter I2 as signal /B2. On the other hand, signals S1 to S4 are supplied to the sources of transistors 51, 61; 52, 62; 53, 63; and 54, 64, respectively. The drains of the transistors 51 and 61 are connected to the gate of the memory cell 31 via a row line W21; the drains of the transistors 52 and 62 are connected to the gate of the memory cell 32 via a row line W22; the drains of the transistors 53 and 63 are connected to the gate of the memory cell 33 via a row line W23; and the drains of the transistors 54 and 64 are connected to the gate of the memory cell 34 via a row line W24. The row lines W21 to W24 are connected to a references potential through the transistors 6 to 9, respectively. The signal B2 is supplied to the gates of the transistors 6 to 9. The signal /B2 is supplied to the select transistor 4 of the memory cell block 127 (2), and signal φ is supplied to the current out-off transistor 1.

FIG. 21 is a timing chart showing the voltage waveforms at the respective nodes, in which (A) shows the waveform of the signal S1; (B) shows that of the signal S2; (C) shows that of the signal S3, (D) shows that of the signal S4; (E) shows that of the signal B1; (F) shows that of the signal B2, (G) shows that of the row line W11; (H) shows that of the row line W12; (I) shows that of the row line W13; (J) shows that of the row line W14, (K) shows that of the row line W21; (L) shows that of the row line W22; (M) shows that of the row line W23; and (N) shows that of the row line W24.

The current out-off transistor 1 is controlled by the signal φ. The transistor 1 is turned on when data is read, and is turned off when data is written.

The memory cell block 127 is a series-connected circuit composed of a plurality of the memory cells 31 to 34, the select transistor 4 and the current cut-off transistor 1. The memory cell block 127 is selected and connected to the column line 128 by the select transistor 4.

The select transistors 4 are connected to the row lines WL10 and WL20, controlled by the signals /B1, /B2 on these row lines, respectively. For instance, when the memory cell block 127 (1) is selected, the signal B1 is set to a logic "0".

In a data read mode, as shown by (A) to (D) in FIG. 21, any one of the signals S1 to S4 is controlled so as to be set to a logic "0" and the remaining other signals are controlled to be set to a logic "1".

Now, as shown by (E) in FIG. 21, when the signal B1 is set to a logic "0", the memory cell block 127 (1) corresponding thereto is selected, and the transistors 51 to 54 and 61 to 64 are all turned on.

In this case, as shown by (F) in FIG. 21, the signal B2 is a logic "1". Accordingly, the memory block 127 (2) corresponding thereto is not selected, and the transistors 51 to 54 and 61 to 64 are all turned off.

In this case, as shown by (G), (H), (I) and (J) in FIG. 21, any one of the row lines W11 to W14 is controlled so as to be set to a logic "0" and the remaining row lines are controlled so as to set to a logic "1" on the basis of the corresponding signals S1 to S4, respectively. These signals are given to the respective control gates of the memory cells 30 to 34, respectively.

On the other hand, since the transistors 6 to 9 are all turned on by the signal B2, as shown by (K), (L), (M) and (N) in FIG. 21, the row lines W21 to W24 are all set to a logic "0".

In contrast with this, as shown by (F) in FIG. 21, when the signal B2 changes to a logic "0" at the time point t1, the memory block 127 (2) corresponding thereto is selected. Under these conditions, as shown by (E) in FIG. 21, the signal B1 changes to a logic "1", and thereby the memory cell block 127 (I) corresponding thereto is not selected.

In this case, as shown by (K), (L), (M) and (N) in FIG. 21, any one of the row lines W21 to W24 is kept at a logic "0" by the signals S1 to S4, and the other remaining lines are set to a logic "1". These signals are given to the control gates of the memory cells 31 to 34, respectively.

On the other hand, since the transistors 6 to 9 are all turned on by the signal B1, as shown by (G), (H), (I) and (J) in FIG. 21, the row lines w11 to W14 are all set to a logic "0".

As described above, it is possible to read data of the memory cell block 127 by selectively setting any one of the gates of the memory cells 31 to 34 of the selected memory block 127 to a logic "0".

Here, in FIG. 20, the case where data is read from any one of the memory cells 31 to 34 of the selected memory cell block 127 is taken into account. In this case, all the row lines other than the row lines connected to the selected memory cells must be charged. This charging is executed by the row decoder 139. In order to complete the charges of these row lines in a short time, a large current supply capability is required.

The signals S1, S2, S3, and S4 are supplied to a1 the memory cell blocks 127. So, the signals S1, S2, S3, and S4 are connected to all the corresponding transistors 51, 52, 53, 54, 61, 62, 63, and 64 of the row decoder 139 through wiring layers. And these wiring layers are arranged from one end to other end of the row decoder 139 through the row decoder 139. So, these wiring layers having a large parasitic capacitance. Consequently the signals S1, S2, S3, and S4 charge the large parasitic capacitance.

In this example shown in FIG. 20, the single memory cell block 127 is composed of four memory cells 31 to 34. In practice, however, it is general that the single memory cell block 127 is composed of 8 or 16 memory cells in order to reduce the chip size and thereby to reduce the cost thereof. For instance, in the case of the memory cell block 127 composed of 16 memory cells, since 16 signals S1, S2, . . . are required, a large charging capability is required.

However, when the integrated circuit itself is driven by a relatively low voltage and further when only the row lines are charged to a boosted voltage by a booster circuit to boost the supply voltage to a high boosted voltage, a large capacitance must be charged by an internal booster circuit (which is relatively low in the current supplying capability). Consequently, there exists such a drawback that a long time is needed to charge the row lines and thereby the data read speed is delayed. In addition, when the memory cell block 127 is shifted from the selected state to non-selected status, the charges of all the row lines must be discharged; that is, the earlier-stored charges are all disused, which is not preferable from the standpoint of power saving.

SUMMARY OF THE INVENTION

With these problems in mind, therefore, it is the primary object of the present invention to provide a semiconducter memory device which can charge the row lines in a short time to get a high data read speed, even when an internal booster circuit is incorporated therein.

Further, when a plurality of memory cells 31, 32, . . . are connected to a select transistor 4 is series, since the memory cell size can be reduced, this type can be widely used as ROMs, without being limited to only the NAND type EEPROM. In this type, however, where the number of memory cells increases in one memory cell block 127, since the row line pitch becomes roughly equal to the size of the one memory cell, the row decoder for selecting the memory cells must be formed at the same pitch as the size of the memory cell transistor. For this purpose, the decoder as shown in FIG. 20 is used to reduce the number of the decoder transistors and thereby to realize a decoder circuit of small occupation area.

Therefore, it is another object of the present invention to provide a decoder in which the number of transistors for constituting the decoder can be reduced and thereby the occupation area required for the decoder can be reduced.

To achieve the above-mentioned object, the present invention provides a semiconductor memory device, comprising: first row lines; selecting transistors driven by the first row lines; second row lines; memory cells driven by the second row lines and connected in series with the selecting transistors; first selecting means for selecting the first row lines; second selecting means for selecting the second row lines; column lines connected to the selecting transistors; data detecting means connected to the column lines, for detecting data stored in the memory cells; first switching means connected between the first selecting means and the second row lines, for selecting the second row lines in response to the second selecting means; and second switching means connected between a potential supply terminal for supplying a predetermined potential and the second row lines, for selecting the second row lines in response to the second selecting means.

The semiconductor memory device further comprises: first row lines; selecting transistors connected to the first row lines; second row lines; memory cells connected to the second row lines and the selecting transistors, the memory cells being selected by the selecting transistors; first selecting means for selecting the first row lines; second selecting means for selecting the second row lines; and switching means controlled by signals from the second selecting means to select the second row lines, and connected between the first selecting means and the second row lines for selecting the memory cells in response to signals from the first selecting means and the signals from the second selecting means.

The semiconductor memory device, comprising: a memory array formed by arranging a plurality of memory blocks into a matrix pattern, each memory block comprising a selecting transistor and a plurality of memory cells connected to the selecting transistor; first row lines connected in common to gates of the selecting transistors arranged in the same row; second row lines connected in common to gates of the memory cells arranged in the same row; first selecting means for selecting the first row lines; second selecting means for selecting the second row lines; a plurality of switching means having one end connected in common to the first selecting means and the other end connected to the corresponding second row lines; and signal lines to which signals from the second selecting means are supplied, being commonly connected to corresponding the plural switching means, wherein the switching means are controlled by the signals from the second selecting means, and the memory cells are selected in response to the signal from the first selecting means and the signals from the second selecting means.

The semiconductor memory device comprising: a plurality of memory cell blocks arranged in matrix array of rows and columns, each of the rows having first and second rows, each memory cell block being constituted between a first terminal and second terminal by memory cells and a select transistor for selecting the memory cell block, each of the memory cells having a gate, the select transistor having a gate, the first terminals of the memory cell blocks in the same column being commonly connected, the gates of the select transistors in the same row being commonly connected and forming the first row, and the gates of the memory cells in the same row being commonly connected and forming the second row; first row selection means for designating the first row; and second row selection means for designating of the second row, including decoding means and a plurality of first switching means, each of the first switching means having a first end and a second end, the first end the first switching means being coupled to the first row selection means, the second end of the first switching means being coupled to the second row, a signal supplied from the decoding means controlling the first switching means, wherein a signal supplied from the first row selection means is applied to the second row through the first switching means in response to the signal from the decoding means.

The semiconductor memory device comprising: a plurality of memory cell blocks arranged in matrix array of rows and columns, each of the rows having first and second rows, each memory cell block being constituted between a first terminal and a second terminal by memory cells and a select transistor for selecting the memory cell block, each of the memory cells having a gate, the select transistor having a gate, the first terminals of the memory cell blocks in the same column being commonly connected, the gates of the select transistors in the same row being commonly connected and forming the first row, and the gates of the memory cells in the same row being commonly connected and forming the second row; and row selection means including first row selection means for designating the first row and second row selection means for designating of the second row, wherein the first row selection means is coupled to the second row selection means, a signal supplied from the first row selection means is supplied to the second row in response to a signal supplied from the second row selection means for selecting the second row.

The semiconductor memory device comprising: a plurality of memory cell blocks arranged in matrix array of rows and columns, each of the rows having first and second rows, each memory cell block being constituted between a first terminal and a second terminal by memory cells and a select transistor for selecting the memory cell block, each of the memory cells having a gate, the select transistor having a gate, the first terminals of the memory cell blocks in the same column being commonly connected, the gates of the select transistors in the same row being commonly connected and forming the first row, and the gates of the memory cells in the same row being commonly connected and forming the second row; row selection means for designating one of the first rows and one of the second rows in response to a row selection signal; and switching means connected between the row selection means and the second row, for controlling a potential level of the second row for designating the memory cell in response to a signal from the row selection means, wherein the potential level of the second row is controlled by a signal supplied through the switching means, the signal supplied through the switching means controls the first row.

The semiconductor memory device comprising: a plurality of memory cell blocks arranged in matrix array of rows and columns, each of the rows having first and second rows, each memory cell block being constituted between a first terminal and a second terminal by memory cells and a select transistor for selecting the memory cell block, each of the memory cells having a gate, the select transistor having a gate, the first terminals of the memory cell blocks in the same column being commonly connected, the gates of the select transistors in the same row being commonly connected and forming the first row, and the gates of the memory cells in the same row being commonly connected and forming the second row; row selection means for designating one of the first rows and one of the second rows in response to a row selection signal; and switching means connected between the row selection means and the second row, for controlling the second row for selecting memory cell which is included in the memory cell block including the select transistor connected to the first row, wherein the memory cell is controlled by a signal supplied through the switching means, and the signal supplied through the switching means controls the select transistor included in the same memory cell block.

In the memory device according to the present invention, when the select transistors connected to the first row line and the memory cells connected to the second row line are accessed by the data detecting means on the column side through the select transistors, the second row line is controlled by first switching means and the potential supply terminal for supplying a predetermined potential is selectively connected to the second row line by the second switching means, in order to increase the speed of charging and discharging the second row line.

DETAILED DESCRIPTION OF THE PREFERRED EMBODIMENTS

Embodiments of the present invention will be described hereinbelow with reference to the attached drawings.

Figure 1:
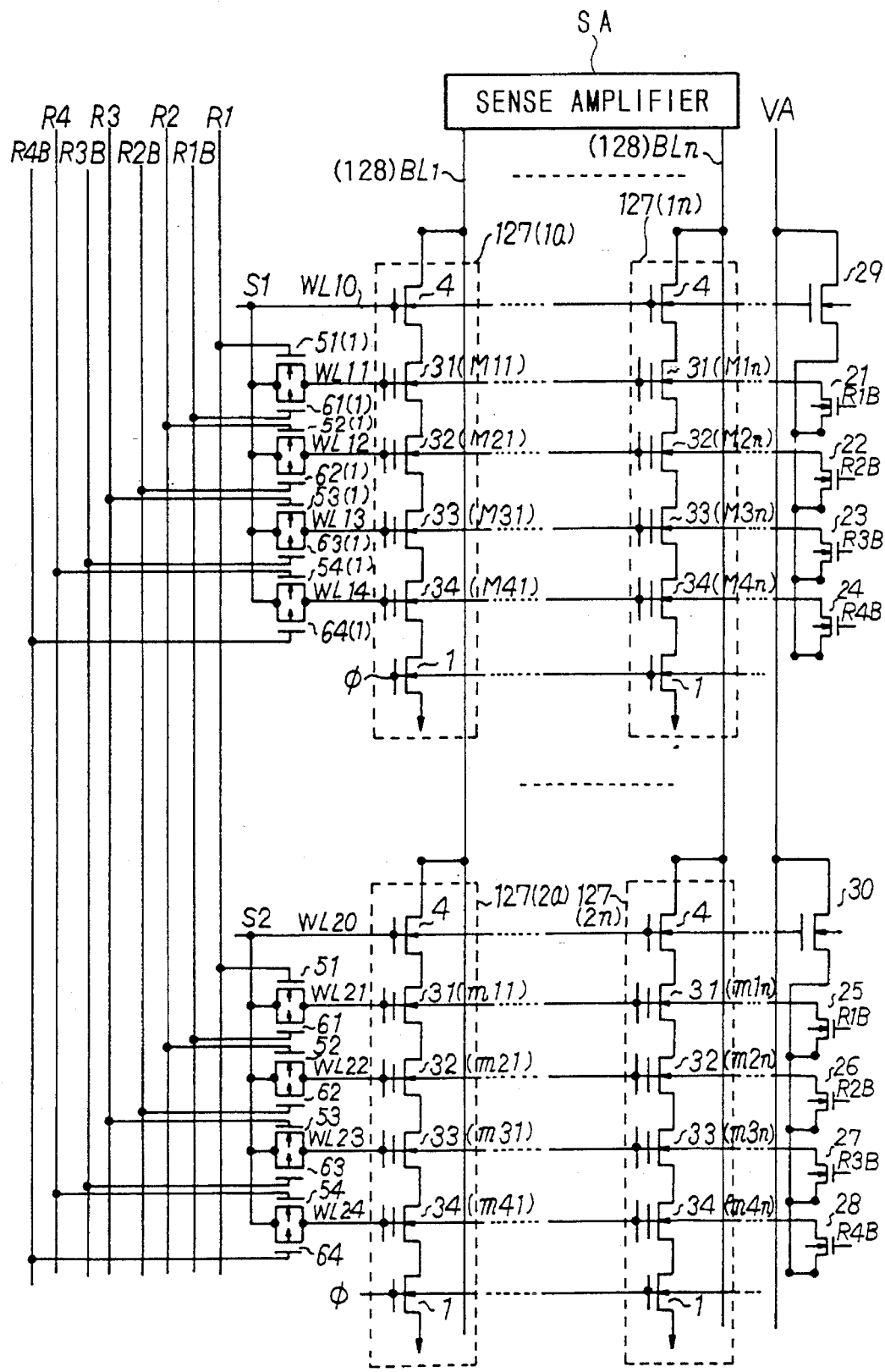
FIG. 1 is a circuit diagram showing a first embodiment of the semiconductor memory device according to the present invention.
Figure 20:
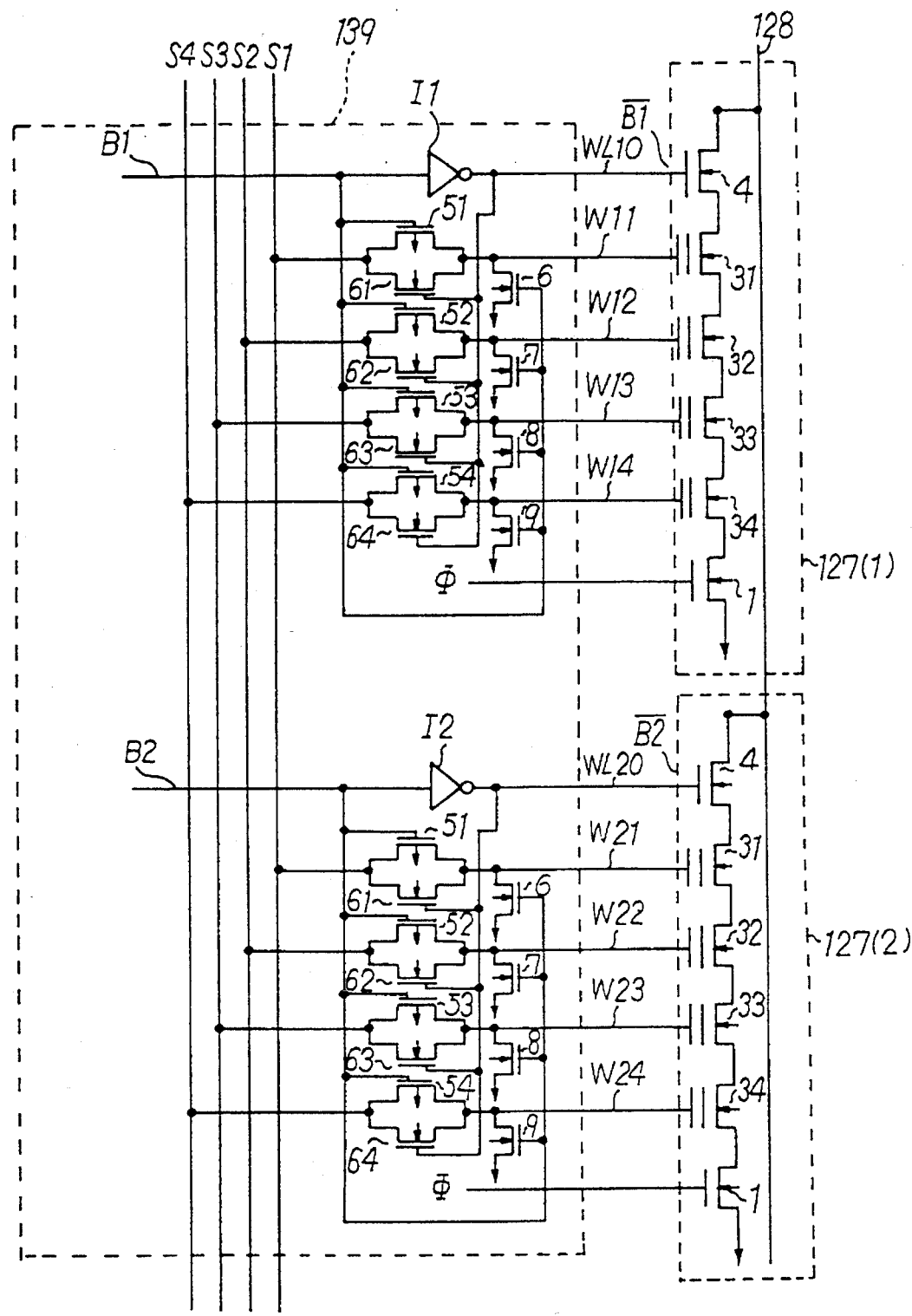
FIG. 20 is a circuit diagram showing a conventional semiconductor memory device, in particular of a conventional EEPROM.
Figure 21:
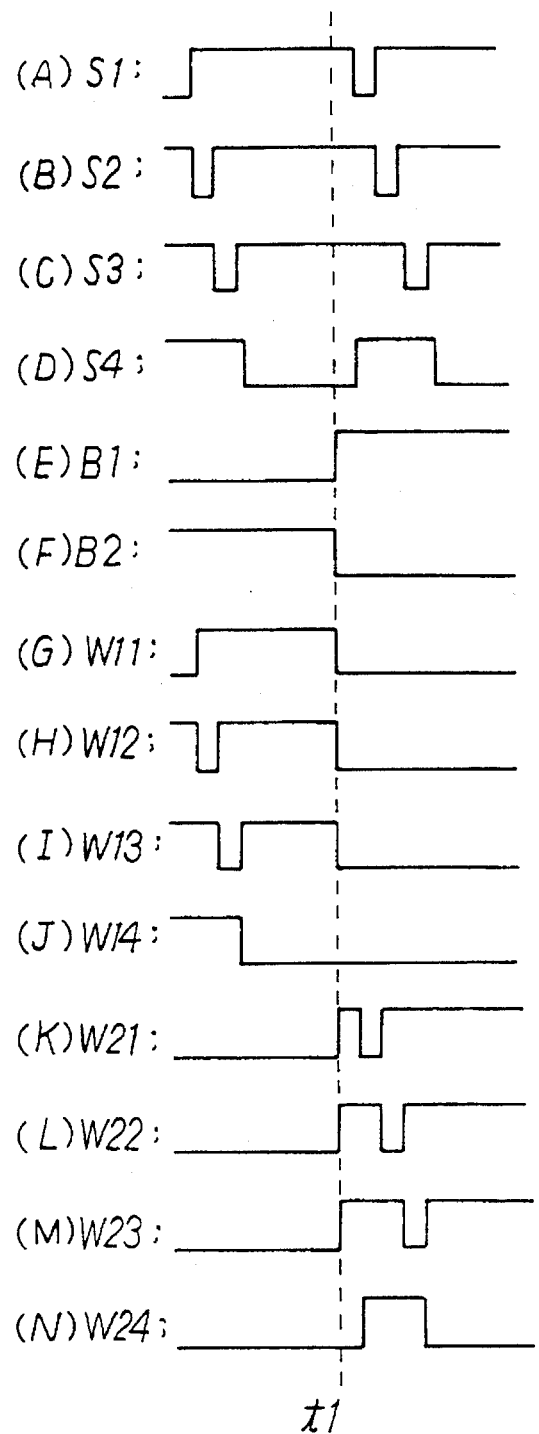
FIG. 21 is a timing chart showing the waveforms at the respective nodes of the circuit shown in FIG. 20.

FIG. 1 shows a first embodiment of the semiconductor memory device. In the drawing, column lines (BL1 to BLn) 128 are connected to a plurality of memory blocks 127. Each memory block 127 is a series-circuit composed of select transistor 4, memory cells 31 to 34 and current cut-off transistor 1. These memory cell blocks 127 are arranged into a matrix form. According to the matrix arrangement, the memory cells 31 to 34 of the respective memory cell blocks 127 (1a), (1n), (2a) and (2n) are denoted by M11 to M41 or M1n to M4n or m11 to m41 or m1n to m4n, respectively. In FIG. 1, the signals S1 and S2 correspond to the signal /B1 and /B2 shown in FIG. 20, respectively.

In each memory cell block 127 of this embodiment, the first row line WL10 connected to the select transistor 4 and the second row lines WL11 to WL14 connected to the gates of the memory cells 31 to 34 are controlled by the signal S1. Accordingly, it is possible to obviate the charge and discharge of the wires through the row decoder by the signals S1 to S4 in FIG. 20, with the result that it is possible to reduce a parasitic capacitance for charging and discharging by the boosted signal in a data read, as compared with the conventional device.

The signals R1 to R4 and R1B to R4B select the row lines WL11 to WL14 or row lines WL21 to WL24. These signals are supplied to the gates of transistors 51 to 54 and 61 to 64 connected between the row lines WL11 to WL14 or WL21 to WL24 and the signals S1, S2, . . ., respectively.

The signals R1B to R4B are also supplied to the gates of the transistors 21 to 24 and the gates of the transistors 25 to 28. The transistors 21 to 24 are connected to potential supply terminal VA for supplying a predetermined potential via transistor 29. The potential supply terminal VA is connected to the row lines WL11 to WL14 when the transistors 21 to 24 and the transistor 29 are turned on. The transistor 29 is turned on or off in response to the signal S1.

On the other hand, the transistors 25 to 28 are connected to the potential supply terminal VA for supplying a predetermined potential via transistor 30. The potential supply terminal VA is connected to the row lines WL21 to WL24 when the transistors 25 to 28 and the transistor 30 are turned on. The transistor 30 is turned on or off in response to the signal S2.

Figure 2:
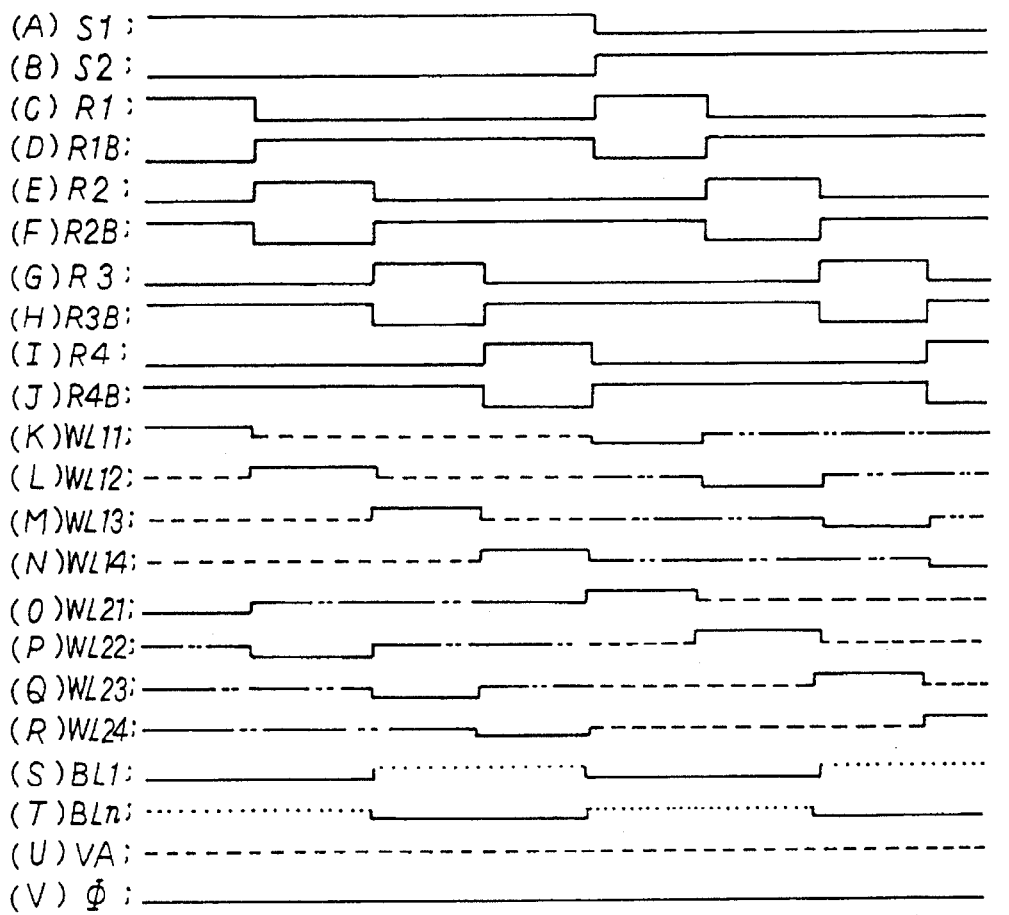
FIG. 2 is a timing chart showing voltage waveforms at the respective nodes of the circuit configuration shown in FIG. 1, when electrons are injected to the floating gates.

In the circuit configuration as described above, the operation of the memory device will be described with reference to the timing chart shown in FIG. 2, in which the voltage waveforms at the respective nodes obtained when electrons are injected to the floating gates of the memory cells are shown. In FIG. 2, (A) shows the waveform of the signal S1; (B) shows that of the signal S2; (C) shows that of the signal R1, (D) shows that of the signal R1B; (E) shows that of the signal R2; (F) shows that of the signal R2B, (G) shows that of the signal R3; (H) shows that of the signal R3B; (I) shows the that of the signal R4; (J) shows that of the signal R4B; (K) shows that of the row line WL11; (L) shows that of the row line WL12; (M) shows that of the row line WL13; and (N) shows that of the row line WL14; (O) shows that of the row line WL21; (P) shows that of the row line WL22; (Q) shows that of the row line WL23; (R) shows that of the row line WL24; (S) shows that of the column line BL1; (T) shows that of the column line BLn; (U) shows that of the potential supply terminal VA; and (V) shows that of the signal φ, respectively.

Here, when the electrons are injected into the floating gates of the memory cells, in advance electrons must be emitted from all the floating gates of the memory cells 31 to 34. In other words, the data stored in all the memory cells 31 to 34 are initialized to one of the binary data. For example, in the case where the memory cells 31 to 34 are N-channel MOS transistors, these transistors are arranged in a P well region of the semiconductor substrate separated from peripheral circuits. When the electrons are emitted, the control gates of the memory cells 31 to 34; that is, the row lines WL11 to WL14 or WL21 to WL24 are set to 0 V and further a high voltage is applied to the P well region in which the memory cells 31 to 34 are formed, in order to emit electrons from the floating gates of the memory cells 31 to 34 to the P well region. As a result, the threshold voltages of the memory cells 31 to 34 become negative values.

There are some methods of setting the row lines WL11 to WL14 or WL21 to WL24 to 0 V. For instance, the signals S1, S2, . . . are set to a logic "1"; the signals R1 to R4 are set to a logic "0"; the signals R1B and R4B are set to a logic "1"; and the potential supply terminal VA is set to 0 V. Under these conditions, 0 V is supplied from the potential supply terminal VA through the transistors 21 to 24, the transistor 29, the transistors 25 to 28 and the transistor 30. Or, the signals S1, S2, . . . are set to a logic "0" (i.e., 0 V); the signals R1 to R4 are set to a logic "1". Under these conditions, the signals S1, S2, . . . of 0 V are supplied to the row lines WL11 to WL14 and the row lines WL21 to WL24 through the transistors 51 to 54.

On the other hand, when electrons are injected into the floating gate, the signal φ is set to a predetermined potential. In this case, the current cut-off transistor 1 connected between the memory cells 31 to 34 and the reference potential is turned off.

Here, the operation will be described under the conditions that a plurality of memory cell blocks 127(1a) to 127(1n) corresponding to the signal S1 are selected; electrons are injected to the floating gate of the memory cell (M11) 31 of the block 127(1a); and electrons have been kept emitted from the floating gates of memory cells M1n) 31 of the other blocks 127(1b) to 127(1n).

Further, the memory cells 31 to 34 of the memory cell blocks 127(2a) to 127(2n) corresponding to the signals (e.g., the signal S2) other than the signal S1 are not selected. When the memory cell block 127(1a) is selected, the signal S1 corresponding thereto is set to a logic "1". A high voltage for injecting electrons must be supplied selectively to the gates of the memory cells 31 to 34. Therefore, the logic "1" for injecting electrons to the floating gates is set to a voltage (e.g., about 20 V) higher than the logic "1" for reading data. On the other hand, in order to set the other memory block 127(2) to the non-select state, the signal S2 corresponding thereto is set to a logic "0" (e.g., 0 V).

When the memory cell (M11) 31 connected to the row line

WL11 is selected, the signal R1 is set to a logic "1" and the signal R1B is set to a logic "0". The signals R2, R3 and R4 corresponding to the non-selected row lines are all set to a logic "0" and the signals R2B, R3B and R4B are all set to a logic "1". In this case, a logic "1" is higher than the voltage for reading data.

Since the signal R1 is the logic "1", the transistor 51(1) of the N-channel MOS transistor is turned on. Since the signal R1B is the logic "0", the transistor 61(1) of the P-channel MOS transistor is also turned on. Therefore, the signal S1 of the logic "1" is supplied to the row line WL11 through the transistors 51(1) and 61(1). On the other hand, since the signals R2, R3 and R4 are the logic "0" and the signals R2B, R3B and R4B are the logic "1", the transistors 52(1), 62(1), 53(1), 63(1), 54(1), 64(1) (having gates to which these signals R2, R3, R4, R2B, R3B and R4B are supplied) are all turned off. As a result, the signal S1 is not supplied to the non-selected row lines WL12, WL13 and WL14.

Further, the row lines WL12 to WL14 are connected to the potential supply terminal VA through the transistor 29 of the N-channel MOS transistor whose gate is controlled in response to the signal S1 and the transistors 22 to 24 of the N-channel MOS transistors whose gates are controlled in response to the signals R2B to R4B. Since the signals R2B to R4B and the signal S1 are the logic "1", the transistors 22 to 24 and the transistor 29 are turned on.

Since the transistor 21 whose gate is controlled by the signal R1B is turned off, the row line WL11 is not connected to the potential supply terminal VA. The row line WL12 is connected to the potential supply terminal VA through the transistor 22 whose gate is controlled by the signal R2B and the transistor 29 whose gate is controlled by the signal S1. In the same way, the row line WL13 is connected to the potential supply terminal VA through the transistor 23 whose gate is controlled by the signal R3B and the transistor 29 whose gate is controlled by the signal S1. In the same way, the row line WL14 is connected to the potential supply terminal VA through the transistor 24 whose gate is controlled by the signal R4B and the transistor 29 whose gate is controlled by the signal S1.

On the other hand, since the signal S2 is a logic "0", the first row line WL20 is a logic "0", so that the select transistor 4 and the transistor 30 connected to this first row line WL20 are both turned off. Further, since the transistors 51 and 61 are both turned on, the signal S2 is supplied to the row line WL21 through the transistors 51 and 61. Since the transistor 25 whose gate is controlled by the signal R1B is turned off, the second row line WL21 is also a logic "0". The transistors 52 to 54 and 62 to 64 are turned off, and the transistors 26, 27 and 28 whose gates are controlled by the signals R2B, R3B, R4B, respectively are turned on. Therefore, although the second row lines WL22, WL23 and WL24 are connected to each other through these transistors 26, 27 and 28, since the transistors 52 to 54, 62 to 64 and the transistor 30 are turned off, the second row lines WL22, WL23 and WL24 are in an electrically floating state. In general, the second row lines WL22, WL23 and WL24 are set to a potential roughly equal to that of the semiconductor substrate (i.e., 0 V) due to a leak current passing through a P-N junction. Therefore, electrons are not injected to the memory cells of the non-selected memory cell block 127(2).

As described above, since the non-select signals R2B, R3B, R4B are all a logic "1", the transistors 22, 23 and 24 are turned on. Further, since the transistor 29 whose gate is controlled by the signal S1 of a logic "1" is turned on, the potential supply terminal VA is connected to the non-selected row lines WL12, WL13 and WL14. At this time, since the potential supply terminal VA is connected to the gates of the non-selected memory cells 32, 33 and 34, the gates of the non-selected memory cells 32, 33 and 34 are set to an appropriate low level so that electrons are not injected into the floating gates thereof.

As shown in FIG. 2, when electrons are injected into the selected memory cell 31 corresponding to M11, since the column line BL1 is set to a logic "0" (e.g., 0 V), this 0 V is transmitted to the channel region of the memory cell 31 through the select transistor 4. Consequently, the voltage difference between the control gate voltage of the memory cell 31 supplied the high voltage signal S1 and the voltage at the channel region is large enough to inject electrons from the channel region into the floating gate, so that the electrons are injected into the floating gate of the memory cell 31.

Although the potential of the channel regions of the memory cells 32, 33 and 34 corresponding to the non-selected memory cells M21, M31 and M41 are also 0 V, since the predetermined potential is supplied from the potential supply terminal VA to the control gates thereof, the voltage difference between the voltage of the control gate and the voltage of the channel region of each of the memory cells M21, M31 and M41 is not large enough to inject electrons from the channel region into the floating gate, so that the electrons are not injected into the floating gates of the non-selected memory cells 32, 33 and 34.

On the other hand, in the memory cell 31 corresponding to M1n, it is required that the threshold voltage of the memory cell M1n is kept at the negative value without injecting electrons into the floating gate thereof. For this purpose, a predetermined voltage is applied to BLn of the column line 128. In other words, although a high voltage is applied to the control gate of the memory cell 31 corresponding to the selected memory cell M1n, the predetermined potential is applied to the channel region thereof, therefore, the voltage difference between the voltage of the control gate and the voltage of the channel region of the memory cell M1n is not large enough to inject electrons into the floating gate thereof. Consequently, electrons are not injected into the floating gate of the memory cell M1n and thereby the threshold voltage of the memory cell M1n is kept at the negative voltage.

In the memory cells 32, 33 and 34 corresponding to the non-selected memory cells M2n, M3n and M4n, the voltage difference between the voltage of the control gate and the voltage of the channel region of each of the memory cells M2n, M3n and M4n is not large enough to inject electrons into the floating gate or to emit electrons from the floating gate thereof, so that the threshold voltages of these memory cells 32, 33 and 34 are kept unchanged.

Here, the reason why the row lines of the non-selected memory cells are set to the predetermined voltage of the potential supply terminal VA is as follows: For instance, when electrons are injected into the floating gate of the memory cell 34 corresponding to the memory cel M4n in FIG. 1, the potential (0 V) of the column line 128 must be transmitted to the memory cell M4n through the memory cells 31, 32 and 33 corresponding to M1n, M2n and M3n. Therefore, the voltage of the potential supply terminal VA is so determined that electrons cannot be injected into the non-selected memory cells and the non-selected memory cells can be turned on, in order to transmit the voltage of 0 V to the selected memory cell.

With reference to FIG. 2, till the time t5 the signal S1 is set to a logic "1" and the signal S2 is set to a logic "0" to select the memory cell block 127 (1). After the time t5, the signal S1 is set to a logic "0" and the signal S2 is set to a logic "1" to select the memory cell block 127 (2). Further, till the time t2 and between the time t5 and the time t6, the signal R1 is set to a logic "1" to select the second row line WL11 or WL21. Further, between the time t2 and the time t3 and between the time t6 and the time t7, the signal R2 is set to a logic "1" to select the second row line WL12 or WL22. Further, between the time t3 and the time t4 and between the time t7 and the time t8, the signal R3 is set to a logic "1" to select the second row line WL13 or WL23. Further, between the time t4 and the time t5 and after the time t8, the signal R4 is set to a logic "1" to select the second row line WL14 or WL24.

All the time periods, the potential supply terminal VA is set to a predetermined potential and the signal $\phi$ is kept at a logic "0".

As shown in FIG. 2, the row line WL11 is a logic "1" between the time t1 and the time t2, is the predetermined potential between the time t2 and the time t5, is the logic "0" between the time t5 and the time t6, and is an electrically floating state after the time t6. Further, the row line WL12 is the predetermined potential between the time t1 and the time t2, is a logic "1" between the time t2 and the time t3, is the predetermined potential between the time t3 and the time t5, is an electrically floating state between the time t5 and the time t6, is a logic "0" between the time t6 and the time t7, and is the electrically floating state after the time t7. Further, the row line WL13 is the predetermined potential between the time t1 and the time t3, is a logic "1" between the time t3 and the time t4, is the predetermined potential between the time t4 and the time t5, is an electrically floating state between the time t5 and the time t7, is a logic "0" between the time t7 and the time t8, and is the electrically floating status after the time t8. Further, the row line WL14 is the predetermined potential between the time t1 and the time t4, is the logic "1" between the time t4 and the time t5, is an electrically floating state between the time t5 and the time t8, and is a logic "0" after the time t8.

On the other hand, the row line WL21 is a logic "0" between the time t1 and the time t2, is an electrically floating state between the time t2 and the time t5, is a logic "1" between the time t5 and the time t6, and is the predetermined potential after the time t6. Further, the row line WL22 is an electrically floating state between the time t1 and the time t2, is a logic "0" between the time t2 and the time t3, is the electrically floating state between the time t3 and the time t5, is the predetermined potential between the time t5 and the time t6, is a logic "1" between the time t6 and the time t7, and is the predetermined potential after the time t7. Further, the row line WL23 is an electrically floating state between the time t1 and the time t3, is a logic "0" between the time t3 and the time t4, is the electrically floating state between the time t4 and the time t5, is the predetermined potential between the time t5 and the time t7, is a logic "1" between the time t7 and the time t8, and is the predetermined potential after the time t8. Further, the row line WL24 is an electrically floating state between the time t4 and the time t4, is a logic "0" between the time t4 and the time t5, is the predetermined potential between the time t5 and the timer t8, and is a logic "1" after the time t8.

The BL1 of the column line 128 is a logic "0" between the time t1 and the time t3, is a predetermined potential between the time t3 and the time t5, is a logic "0" between the time t5 and the time t7, and is the predetermined potential after the time t7.

On the other hand, the BLn of the column line 128 is the predetermined potential between the time t1 and the time t3, is a logic "0" between the time t3 and the time t5, is the predetermined potential between the time t5 and the time t7, and is a logic "0" after the time t7.

In the above-mentioned operation electrons are injected into the memory cell 31 corresponding to M11, and electrons are not injected into the memory cell 31 corresponding to M1n, the threshold voltage of the memory cell M1n is kept unchanged, between the time t1 and the time t2.

Between the time t2 and the time t3, electrons are injected into the memory cell 32 corresponding to M21, and the threshold voltage of the memory cell 32 corresponding to M2n is kept unchanged. Further, between the time t3 and the time t4, the threshold voltage of the memory cell 33 corresponding to M31 is kept unchanged because the potential of the column line BL1 changes to the predetermined potential, and electrons are injected into the memory cell 33 corresponding to M3n because the column line BLn is a logic "0". Further, between the time t4 and the time t5, the threshold voltage of the memory cell 34 corresponding to M41 is kept unchanged, and electrons are injected into the memory cell 34 corresponding to M4n. Further, between the time t5 and the time t6, electrons are injected into the memory cell 31 corresponding to m11, and the threshold voltage of the memory cell 31 corresponding to m1n is kept unchanged. Further, between the time t6 and the time t7, electrons are injected into the memory cell 32 corresponding to m21, and the threshold voltage of the memory cell 32 corresponding to m2n is kept unchanged. Further, between the time t7 and the time t8, the threshold voltage of the memory cell 33 corresponding to m31 is kept unchanged, and electrons are injected into the memory cell 33 corresponding to m3n. Further, after t8, the threshold voltage of the memory cell 34 corresponding to m41 is kept unchanged, and electrons are injected into the memory cell 34 corresponding to m4n.

As described above, when a memory cell is selected, a high voltage is applied to the control gate thereof. And, electrons are injected into the floating gate of the selected memory cell when the channel region of the selected memory cell is 0 V. Electrons are not injected into the floating gate of the selected memory cell, if the channel region of the selected memory cell is a predetermined potential. In this case, the high voltage which is supplied to the gate of the select transistor 4 and the control gate of the selected memory cell is not supplied by using the signals R1–R4 and R1B–R4B, therefore, the capacitance to which the high voltage is supplied can be reduced, as compared with the conventional semiconductor memory device. Accordingly, when the high voltage is generated by a charge pump circuit arranged in the integrated circuit, it is possible to shorten the time required to raise the voltage to a predetermined high value, so that it is possible to reduce the time required to inject electrons.

In this connection, when a selected row line is switched to a new row line from a preceding selected row line, since a high voltage remains on the preceding selected row line, there exists a possibility of occurrence of an erroneous operation. So, it is preferable to execute the succeeding operation after the row lines have been returned to an initial state.

Figure 3:
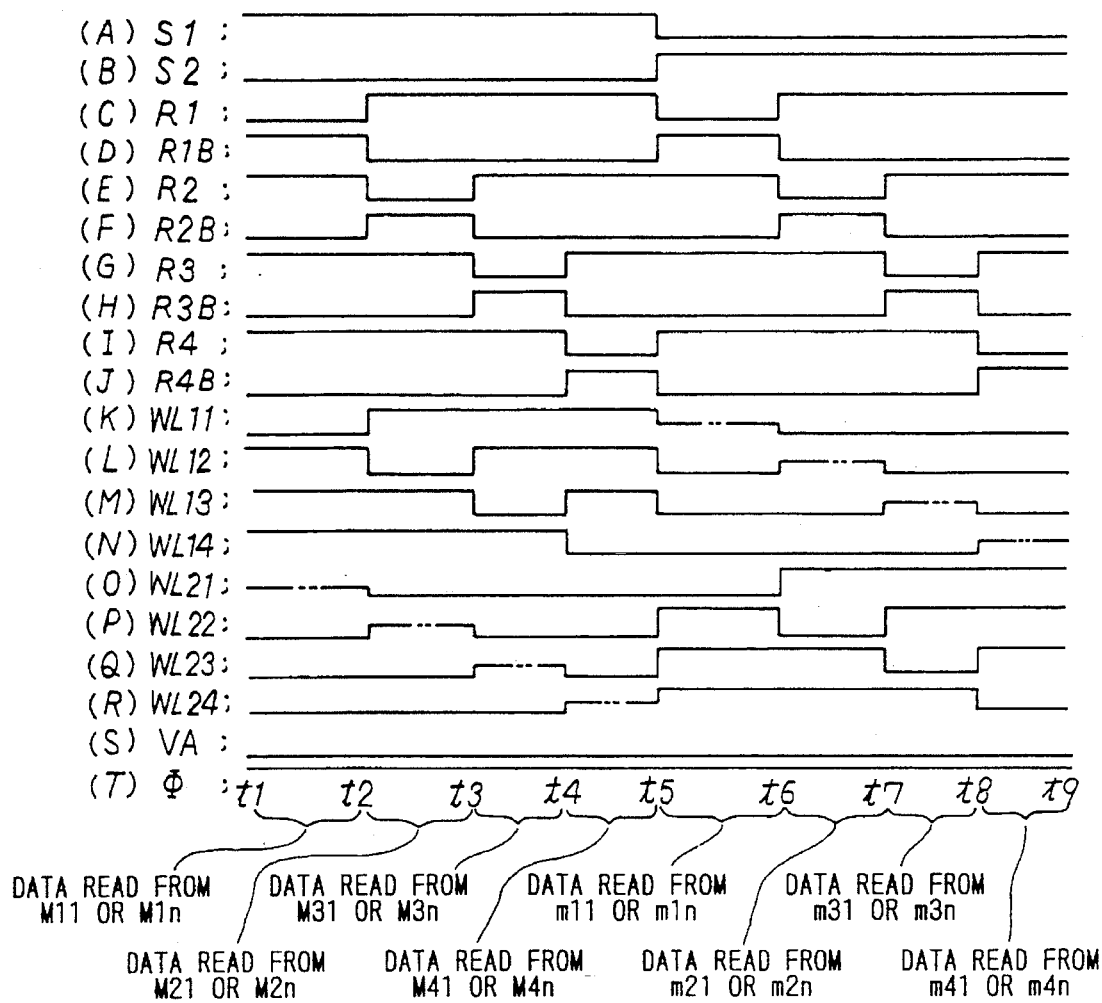
FIG. 3 is a timing chart showing voltage waveforms at the respective nodes of the circuit configuration shown in FIG. 1, when data are read from the memory device.

With reference to FIG. 3, the operation of reading data from the memory cells will be described hereinbelow. FIG. 3 shows the voltage waveforms at the respective nodes of when the data are read from the memory cells 31 to 34, in which (A) shows the waveform of the signal S1; (B) shows that of the signal S2; (C) shows that of the signal R1, (D)

shows that of the signal R1B; (E) shows that of the signal R2; (F) shows that of the signal R2B, (G) shows that of the signal R3; (H) shows that of the signal R3B; (I) shows the that of the signal R4; (J) shows that of the signal R4B; (K) shows that of the row line WL11; (L) shows that of the row line WL12; (M) shows that of the row line WL13; and (N) shows that of the row line WL14; (O) shows that of the row line WL21; (P) shows that of the row line WL22; (Q) shows that of the row line WL23; (R) shows that of the row line WL24; (S) shows that of the potential supply terminal VA; and (V) shows that of the signal φ.

When data are read from the memory cells 31 to 34 constituting the memory cell block 127, the potential supply terminal VA is set to a logic "0" (e.g., 0 V). Further, the signal φ is set to a logic "1" to turn on the current cut-off transistor 1.

When the row line WL11 is selected and data is read from the memory cell 31 corresponding to M11 or M1n, the signal S1 corresponding to the selected row line is set to a logic "1", and the signal S2 corresponding to the non-selected row line is set to a logic "0". When the row line WL11 is selected, the signal R1 is set to a logic "0" and the signal R1B is set to a logic "1". Further, the other signals R2, R3 and R4 are set to a logic "1" and the signals R2B, R3B and R4B are set to a logic "0". Accordingly, the transistors 51 and 61 are turned off, and the transistors 52 to 54 and 62 to 64 are turned on. Further, the transistor 21 is turned on, and the transistors 22, 23 and 24 are turned off. On the other hand, the transistor 29 is turned on because the signal S1 of a logic "1" is applied to the gate thereof. Consequently, the voltage of the potential supply terminal VA is applied to the row line WL11 through the transistors 29 and 21, so that the row line WL11 is set to a logic "0".

On the other hand, since the signal S1 is applied to the row lines WL12, WL13 and WL14 through the turned-on transistors 52, 53 and 54 and the turned-on transistors 62, 63 and 64 respectively, these row lines WL12, WL13 and WL14 are all set to a logic "1". As described above, with respect to the memory cell block 127 including the selected memory cell 31, the selected row line WL11 is set to a logic "0" and the non-selected row lines WL12, WL13 and WL14 are set to a logic "1".

In this embodiment, this logic "1" is applied as the signal S1 for controlling the select transistor 4. With respect to the memory cell block 127 not including the selected memory cell, since the signal S2 is a logic "0", the signal S2 is applied to the row lines WL22, WL23 and WL24 through the transistors 52, 62, 53, 63, 54 and 64. So, the row lines WL22, WL23 and WL24 are set to a logic "0". Further, since the signal S2 is a logic "0" and thereby the transistor 30 is turned off, the row line WL21 is at an electrically floating state. However, since the signal S2 is a logic "0" and the transistor 4 controlled by the signal S2 is turned off, there exists no problem. If a transistor which is turned on in a data read mode is connected in paralel to the transistor 29 or 30, the electrically floating state of the row line can be averted.

Here, since the signal S1 is a logic "1, the select transistor 4 controlled by the signal S1 is turned on. Further, since the gates of the non-selected memory cells connected to the selected memory cell are a logic "1", these non-selected memory cells are turned on. If electrons are injected into the floating gate of the selected memory cell, the threshold voltage of the selected memory cell is a positive value. Since a selecting signal of a logic "0" is applied to the selected memory cell, the selected memory cell is turned off when electrons are injected into the floating gate of the selected memory cell. When the memory cell injected electrons is selected, the column line 128 which is previously charged is kept a charged state because a current does not flow the selected memory cell. A data stored in the selected memory cell is read by sensing the charged state of the column line 128 by a sense amplifier. When electrons are discharged from the floating gate of the selected memory cell, the threshold voltage of the memory cell is negative, so that the selected memory cell is turned on even if the control gate thereof is a logic "0". Consequently, the previously charged column line 128 is discharged through the selected memory cell. This discharged state of the column line 128 is detected by the sense amplifier.

With reference to FIG. 3, till the time t5, the signal S1 is set to a logic "1" and the signal S2 is set to a logic "0" to select the memory cell block 127 (1). After the time t5, the signal S1 is set to a logic "0" and the signal S2 is set to a logic "1" to select the memory cell block 127 (2). Further, between the time t1 and the time t2, the signal R1 is set to a logic "0", the signal R1B is set to a logic "1", the signals R2 to R4 are set to a logic "1" and the signals R2B to R4B are set to a logic "0" to select the second row line WL11. Further, between the time t2 and the time t3, the signal R2 is set to a logic "0", the signal R2B is set to a logic "1", the signals R1, R3 and R4 are set to a logic "1" and the signals R1B, R3B and R4B are set to a logic "0" to select the second row line WL12. Further, between the time t3 and the time t4, the signal R3 is set to a logic "0", the signal R3B is set to a logic "1", the signals R1, R2 and R4 are set to a logic "1" and the signal R1B, R2B and R4B are set to a logic "0" to select the second row line WL13. Further, between the time t4 and the time t5, the signal R4 is set to a logic "0", the signal R4B is set to a logic "1", the signals R1, R2 and R3 are set to a logic "1" and the signals R1B, R2B and R3B are set to a logic "0" to select the second row line WL14. Further, between the time t5 and the time t6, the signal R1 is set to a logic "0", the signal R1B is set to a logic "1", the signals R2, R3 and R4 are set to a logic "1" and the signals R2B, R3B and R4B are set to a logic "0" to select the second row line WL21. Further, between the time t6 and the time t7, the signal R2 is set to a logic "0", the signal R2B is set to a logic "1", the signals R1, R3 and R4 are set to a logic "1" and the signals R1B, R3B and R4B are set to a logic "0" to select the second row line WL12. Further, between the time t7 and the time t8, the signal R3 is set to a logic "0", the signal R3B is set to a logic "1", the signals R1, R2 and R4 are set to a logic "1" and the signals R1B, R2B and R4B are set to a logic "0" to select the second row line WL23. Further, between the time t8 and the time t9, the signal R4 is set to a logic "0", the signal R4B is set to a logic "1", the signals R1, R2 and R3 are set to a logic "1" and the signals R1B, R2B and R3B are set to a logic "0" to select the second row line WL24.

During all the periods, the potential supply terminal VA is set to 0 V and the signal φ is set to a logic "1".

As shown in FIG. 3, the row line WL11 is a logic "0" between the time t1 and the time t2, and after the time t6, is an electrically floating state between the time t5 and the time t6, and is a logic "1" at the other times. Further, the row line WL12 is a logic "1" till the time t2 and between the time t3 and the time t5, is an electrically floating state between the time t6 and the time t7, and is a logic "0" at the other times. Further, the row line WL13 is a logic "1" till the time t3 and between the time t4 and the time t5, is an electrically floating state between the time t7 and the time t8, and is a logic "0" at the other times. Further, the row line WL14 is a logic "1" till the time t4, is an electrically floating state after the time t8, and is a logic "0" at the other times.

On the other hand, the row line WL21 is an electrically floating state till the time t2, is a logic "1" after the time t6, and is a logic "0" at the other times. On the other hand, the row line WL22 is an electrically floating state between the time t2 and the time t3, is a logic "1" between the time t5 and the time t6 and after the time t7, and is a logic "0" at the other times. Further, the row line WL23 is an electrically floating state between the time t3 and the time t4, is a logic "1" between the time t5 and the time t7 and after that time t8, and is a logic "0" at the other times. Further, the row line WL24 is an electrically floating state between the time t4 and the time t5, is a logic "1" between the time t5 and the time t8, and is a logic "1" at the other times.

Data are read from the memory cells 31 corresponding to M11 to M1n between the time t1 and the time t2. On the other hand, between the time t2 and the time t3, data are read from the memory cells 32 corresponding to M21 to M2n. Further, between the time t3 and the time t4, data are read from the memory cells 33 corresponding to M31 to M3n. On the other hand, between the time t4 and the time t5, data are read from the memory cells 34 corresponding to M41 to M4n. Further, between the time t5 and the time t6, data are read from the memory cells 31 corresponding to m11 to min. On the other hand, between the time t6 and the time t7, data are read from the memory cells 32 corresponding to m21 to m2n. Further, between the time t7 and the time t8, data are read from the memory cells 33 corresponding to m31 to m3n. On the other hand, between the time t8 and the time t9, data are read from the memory cells 34 corresponding to m41 to m4n.

Figure 4:
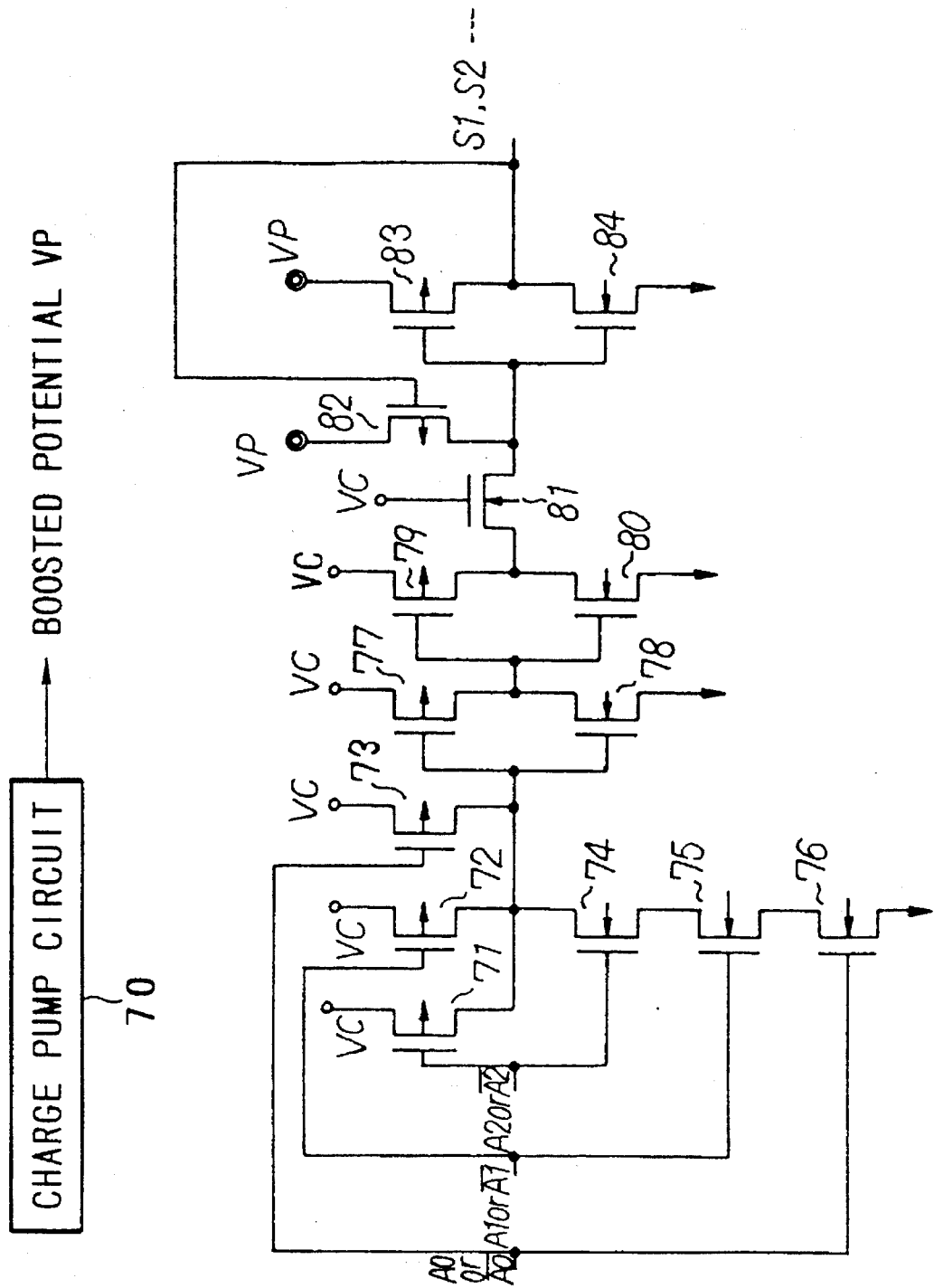
FIG. 4 is a circuit diagram showing an example of circuits for outputting signals S1, S2, . . . in the circuit configuration shown in FIG. 1.

FIG. 4 shows an example of a decode circuit for outputting the signals S1 and S2 for controlling the select transistor 4. In FIG. 4, a boosted voltage VP is outputted from a charge pump circuit 70. An address signal A0 or /A0 is inputted to the gates of P-channel MOS transistor 73 and N-channel MOS transistor 76. On the other hand, an address signal A1 or /A1 is inputted to the gates of P-channel MOS transistor 72 and N-channel MOS transistor 75. Further, an address signal A2 or /A2 is inputted to the gates of P-channel MOS transistor 71 and N-channel MOS transistor 74. The transistors 71 to 76 constitute an NAND circuit. The output of this NAND circuit is inputted to an inverter composed of P-channel MOS transistor 77 and N-channel transistor 78, and the output of this inverter is inputted to an inverter composed of P-channel MOS transistor 79 and N-channel transistor 80. The output of this inverter is inputted to the gates of P-channel MOS transistor 83 and N-channel MOS transistor 84 via N-channel MOS transistor 81. The transistors 83 and 84 are serially connected between the output of the charge pump circuit 70 and a reference potential. The connecting point of the transistors 83 and 84 is connected to the gate of P-channel MOS transistor 82. For example, the signal S1 which is applied to the gate of the select transistor 4 is outputted from the connecting point of the transistors 83 and 84. The drain of this transistor 82 is connected to the gates of the transistors 83 and 84. An external supply voltage VC is supplied to the sources of the transistors 71, 72, 77 and 79 and the gate of the transistor 81. The boosted voltage VP of the charge pump circuit 70 is supplied to the source of the transistors 82 and 83. Further, the sources of the transistors 76, 78, 80 and 84 are connected to a reference potential.

In the circuit configuration as described above, the charge pump circuit 70 boosts the voltage VC to generate the boosted voltage VP. This boosted voltage VP is a high voltage so that electrons can be injected into the floating gates of the memory cells in a data write mode. In a data read mode, the voltage VP is lower than the voltage VP of the data write mode. Further, in the data read mode, it is possible to set the voltage VP to that equal to the supply voltage VC.

Further, in the case of the example shown in FIG. 4, eight signals S1, S2, . . . which are generated from the decode circuit correspond to combination of the addresses A0, A1 and A2 and the inversion signals thereof /A0, /A1 and /A2. In this case, the voltages of the signals S1, S2, . . . are equal to the output voltage (i.e., boosted voltage VP) of the charge pump circuit 70.

Figure 5:
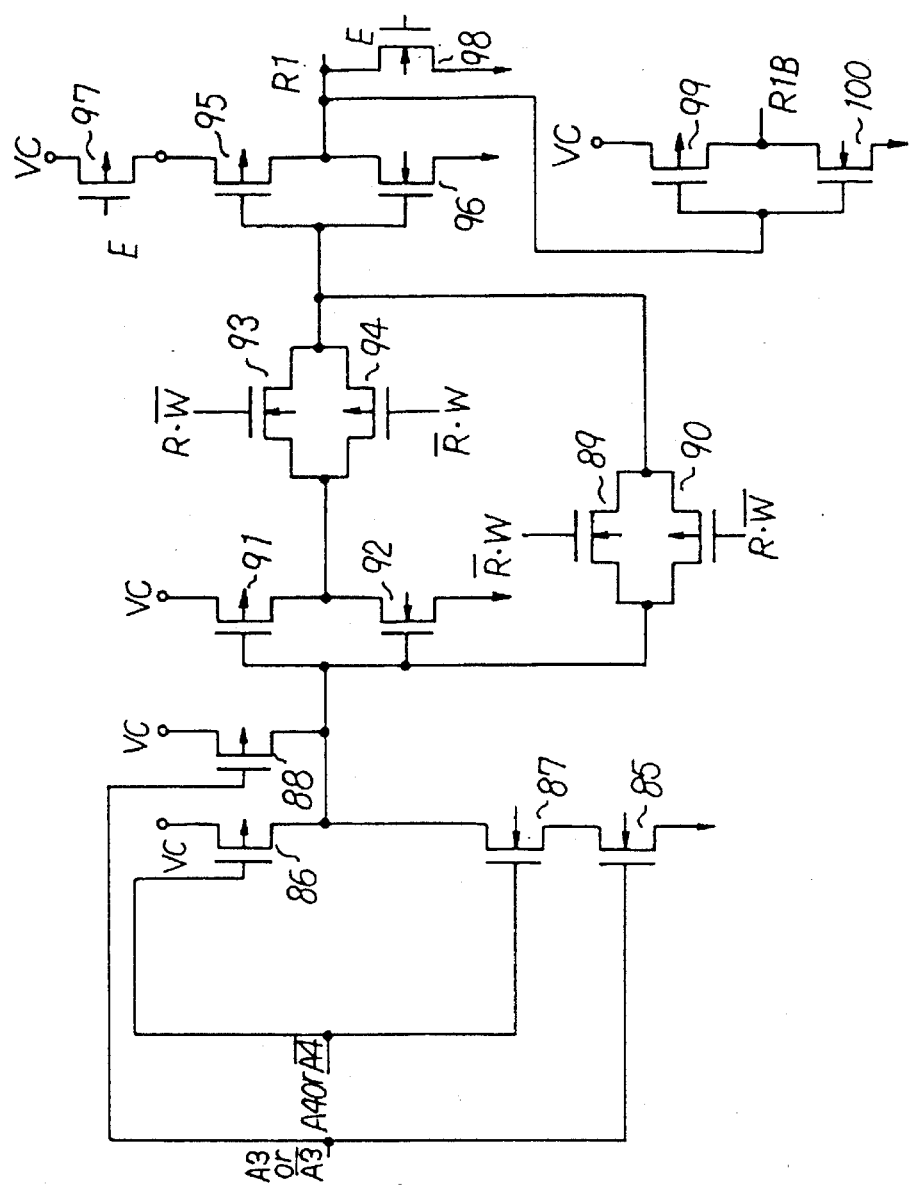
FIG. 5 is a circuit diagram showing an example of circuits for outputting signals R1, R1B, . . . in the circuit configuration shown in FIG. 1.

FIG. 5 shows an example of a decode circuit for outputting the signals R1 to R4 and the signals R1B to R4B. As shown, the address signals A3 and A4 and the inversion signals thereof /A3 and /A4 are inputted to a NAND logic circuit composed of P-channel MOS transistors 86 and 88 and N-channel MOS transistors 85 and 87. The output of the NAND logic circuit is applied to a first gate circuit composed of N-channel MOS transistor 89 and P-channel MOS transistor 90, and an inverter composed of P-channel MOS transistor 91 and N-channel MOS transistor 92. The outputs of the inverter composed of the transistors 91 and 92 is applied to a second gate circuit composed of N-channel MOS transistor 93 and P-channel MOS transistor 94. The outputs of the first and second gate circuits are connected to the gates of P-channel MOS transistor 95 and N-channel transistor 96. Further, the supply voltage VC is supplied to the source of the transistor 95 via P-channel MOS transistor 97. The signal R1 can be obtained from a connecting point of the drains of the transistors 95 and 96. This signal R1 is inverted by an inverter composed of P-channel MOS transistor 99 and N-channel MOS transistor 100, and then outputted as the signal R1B. Further, the drains of the transistors 95 and 96 and the gates of the transistors 99 and 100 are connected to a reference potential via N-channel MOS transistor 98. Signal E is applied to the gates of the transistors 97 and 98. Further, signal R·/W is applied to the gates of the transistors 90 and 93, and signal /R·W is applied to the gates of the transistors 89 and 94. The signal R·/W is a logic "1" in a data read mode and is a logic "0" in a data write mode. The signal /R·W is a logic "0" in the data read mode, and is a logic "1" in the data write mode. Further, the signal E is a logic "1" when electrons are emitted from the floating gate of the memory cell.

In the circuit configuration as described above, when electrons are emitted from the floating gate, the signal E changes to a logic "1". As a result, the signal R1 changes to a logic "0", and the signal R1B changes to a logic "1". In FIG. 4, if the signals A0, /A0, A1, /A1, A2, /A2 are all set to a logic "1", the signals S1, S2, . . . change all to a logic "1". At this time, since the voltage of the potential supply terminal VA is set to 0 V, all the row lines which are connected to the control gates of the memory cells are set to 0 V.

On the other hand, the signals R1 to R4 and R1B to R4B can be determined by the combination of the address signals A3, /A3 and A4, /A4. The output of the NAND logic circuit is transmitted through one of two signal transmission paths selected by the first and second gate circuits in response to the signals R·/W and /R·W. In the data read mode, the first gate circuit composed of the transistors 89 and 90 is turned off and the second gate circuit composed of the transistors 93 and 94 is turned on. Consequently, the output signal of the NAND logic circuit is applied through the inverter composed the transistors 91 and 92. In the data write mode, the first gate circuit is turned on and the second gate circuit is turned off. Consequently, the output signal of the NAND logic circuit is applied to the gates of the transistors 95 and 96 through the first gate circuit. The logic level of the output signal of the decode circuit of FIG. 5 can be changed so as to be different from each other between the data write mode and the data read mode. For instance, in the data read mode shown by the waveform in FIG. 2, the signal R1 is a logic "1" when selected. However, in the data read mode shown by the waveform in FIG. 3, the signal R1 is a logic "0" when selected.

Further, in a data read mode, if the boosted voltage VP is supplied to the decode circuit for generating the signals S1, S2 of FIG. 4, the boosted voltage VP is also supplied to the decode circuit of FIG. 5 instead of the power supply voltage VC. For example, the boosted signal S2 is supplied to a selected first row line and non-selected second row lines related to the first row line. Here, in FIG. 1, in the case where the second row line WL21 is selected and is set 0 V, if the potential of the signal S2 becomes higher than a value of an addition of the gate voltage of the transistor 61 and the absolute value of the threshold voltage of the transistor 61, the transistor 61 is turned on. Consequently, since the voltage of the signal S2 is discharged to the WL21 of 0 V through the transistor 61, the potentials of the non-selected second row lines WL22 to WL24 are limited to the addition of the gate voltage of the transistor 61, namely the potential of the signal R1B, and the absolute value of the threshold voltage of the transistor 61.

Further, in the circuit configuration shown in FIG. 5, the signals R1 to R4 and R1B to R4B are outputted in addition to the signals R1 and R1B.

Figure 6:
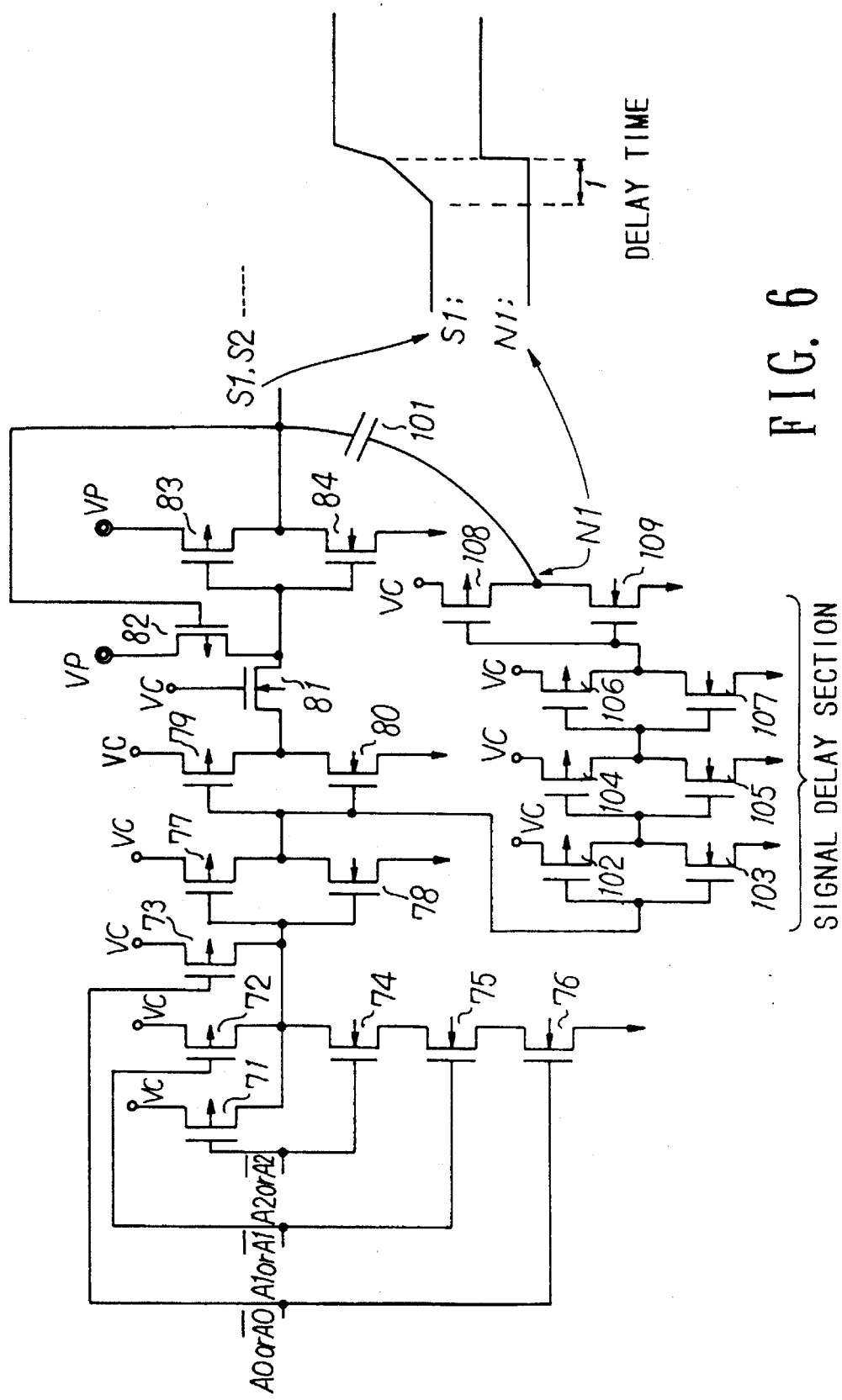
FIG. 6 is a circuit diagram showing another example of circuits for outputting signals S1, S2, . . . in the circuit configuration shown in FIG. 1.

FIG. 6 shows another example of the circuit for outputting the signals S1, S2, . . . . This circuit is different from the circuit shown in FIG. 4 in that a signal delaying section and a capacitance are additionally provided. The output of the inverter composed of the transistors 77 and 78 is connected to node N1 via a signal delay section, that is, a series-connected inverter circuit composed of P-channel MOS transistor 102 and N-channel MOS transistor 103, an inverter composed of a P-channel MOS transistor 104 and N-channel MOS transistor 105, an inverter composed of P-channel MOS transistor 106 and N-channel MOS transistor 107, and an inverter composed of P-channel MOS transistor 108 and N-channel MOS transistor 109. The node N1 is connected to the drains of the transistors 83 and 84 via a capacitance 101.

The above-mentioned circuits are suitable to boost the voltage VC to the boosted voltage VP and to output the boosted voltage VP as the signals S1, S2, . . . In other words, in general, when a boosted voltage VP is generated by a charge pump circuit within the integrated circuit, since the current supply capability of the charge pump circuit is not so large, when a node of a large capacitance is charged by the charge pump circuit, there exists a problem in that the charge time is relatively long.

In contrast with the circuit shown in FIG. 6, a capacitance is provided between the signal S1 and the node N1, for boosting the voltage of the signal S1 by using this capacitance. Accordingly, it is possible to boost the signal S1 quickly, as shown by the voltage waveform shown in FIG. 6. In more detail, when the signal S1 rises to some extent, a pulse signal is outputted from the node N1 being delayed by a delay by time (determined by the signal delaying section) from the signal S1, so that the potential of the signal S1 is raised up by this pulse signal from the node N1 by using the capacitance coupling between the both ends of the capacitance 101. The boosted potential is held by the boosted potential VP. Accordingly, it is possible to output the potential VP quickly and securely as the signal S1.

Figure 7:
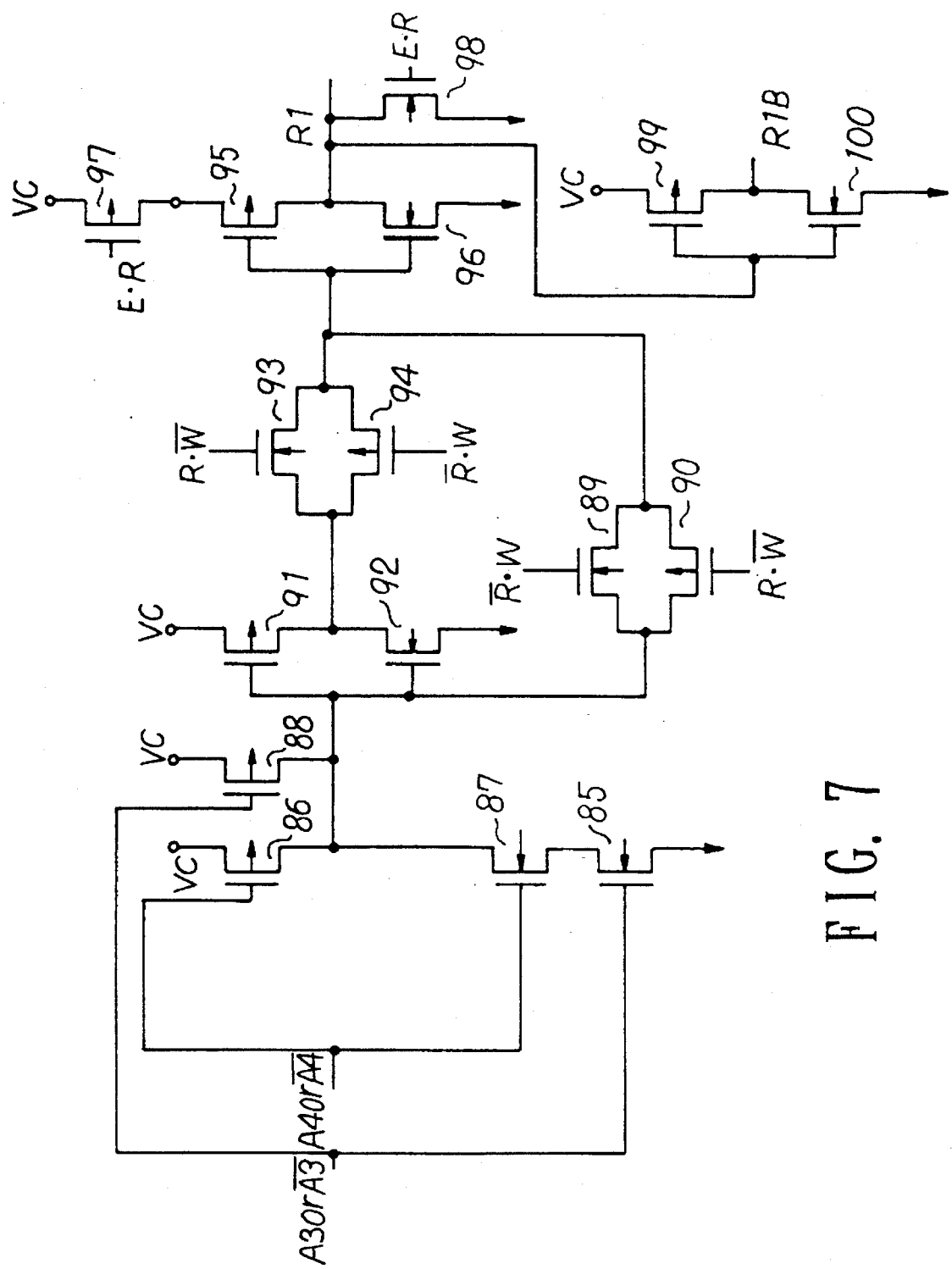
FIG. 7 is a circuit diagram showing another example of circuits for outputting signals R1, R1B, . . . in the circuit configuration shown in FIG. 1.
Figure 8:
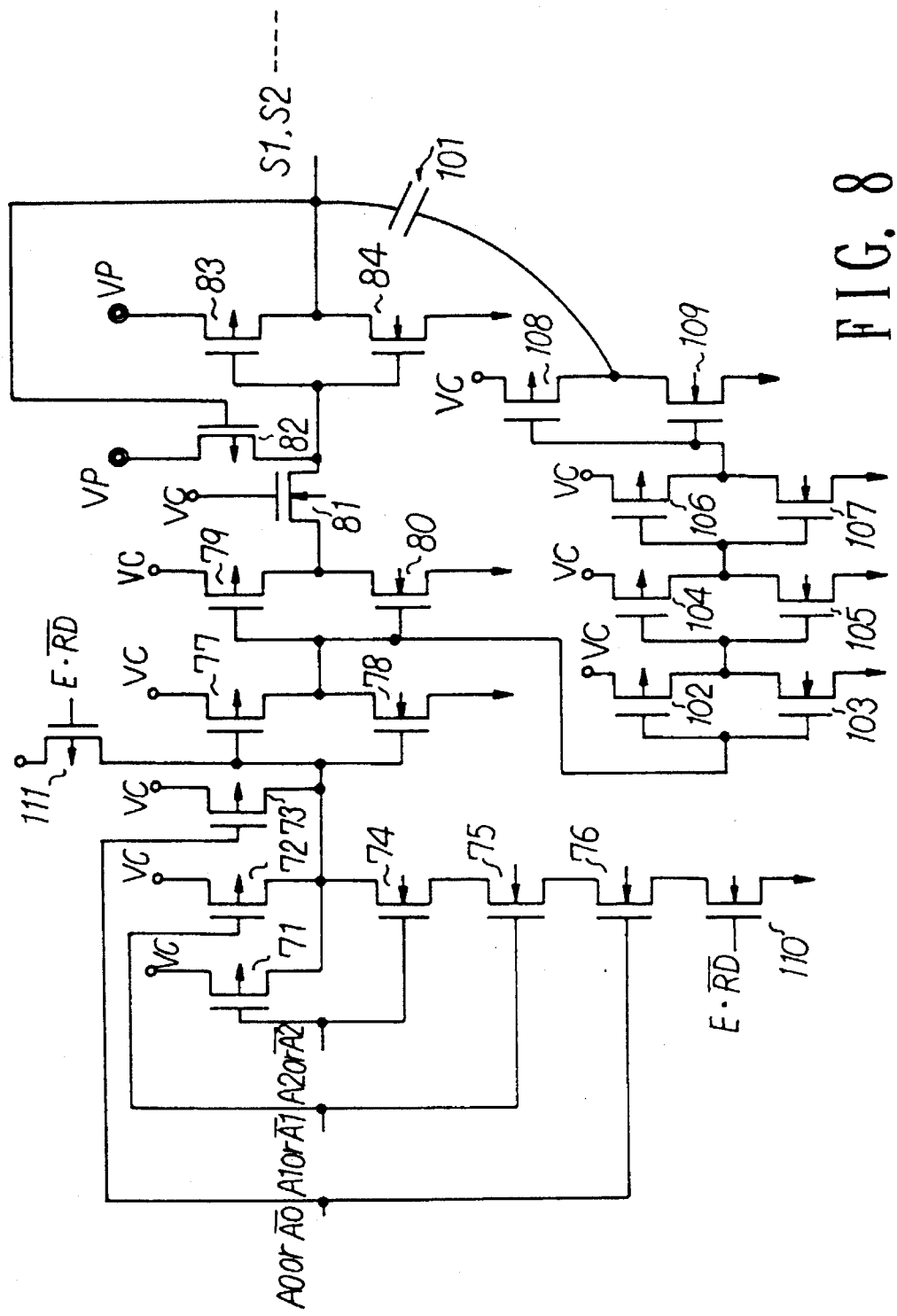
FIG. 8 is a circuit diagram showing still another example of circuits for outputting signals S1, S2, . . . in the circuit configuration shown in FIG. 1.

FIG. 7 shows another example of the circuit for outputting the signals R1 to R4 and R1B to R4B, and FIG. 8 shows still another circuit for outputting the signals S1, S2, . . . The point different between the circuit shown in FIG. 7 and that shown in FIG. 5 is that the signal E·R is applied to the gates of the transistors 97 and 98, instead of the signal E. On the other hand, the point different between the circuit shown in FIG. 8 and that shown in FIG. 6 is that the gates of the transistors 77 and 78 are connected to the supply voltage VC via P-channel MOS transistor 111 and further the source of the transistor 76 is connected to a reference potential via N-channel MOS transistor 110. The signal E·/RD is applied to the gates of the transistors 110 and 111.

Figure 9:
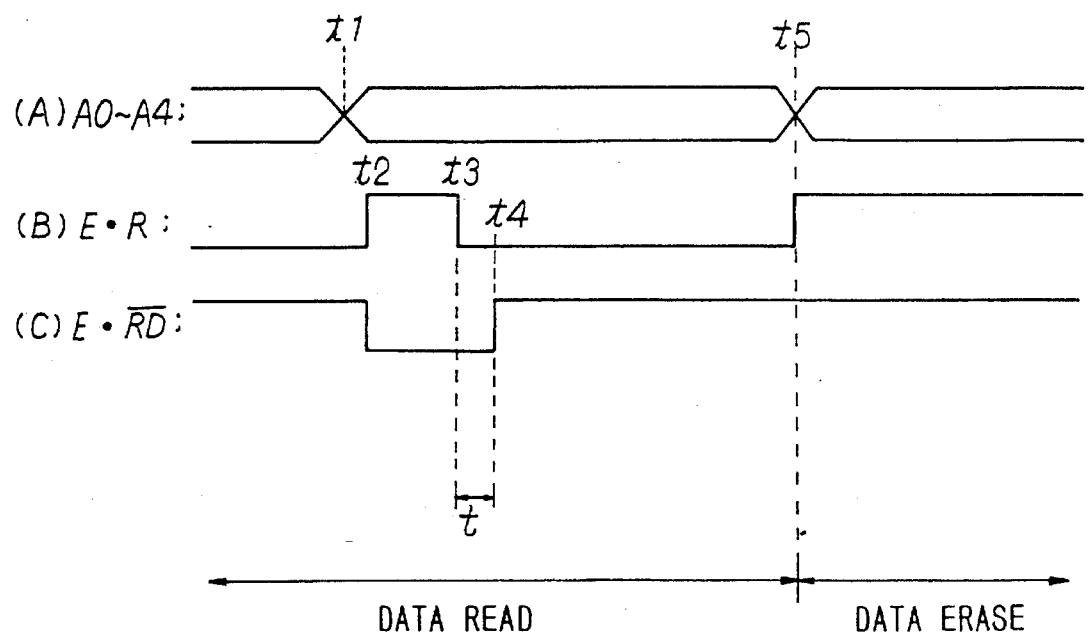
FIG. 9 is a timing chart for assistance in explaining the operation of the circuits shown in FIGS. 7 and 8.

The operation of the circuits as configured above will be described hereinbelow with reference to FIG. 9. In FIG. 9, (A) denotes the waveform of the address signals A0 to A4; (B) denotes that of the signal E·R; and (C) denotes that of the signal E·/RD. Further, the address signals change at the time t1. The signal E·R is set to a logic "1" between the time t2 and the time t3. The signal E·/RD is a logic "1" till the time t2, and is set to a logic "0" between the time t2 and the time t4. Further, there exists a time difference t between the time t3 and the time t4. The period before the time t5 corresponds to a data read mode, and the period after the time t5 corresponds to a data erase mode. In the data erase mode, electrons are emited from the floating gate of the memory cell for initializing the storage state of the memory cell. The signals E·R and E·/RD are set to a logic "1" in the data erase mode.

As shown in FIGS. 7 and 8, when an address signal changes to select a new memory cell, the signal R1 changes at the time t3 in response to the signal E·R and thereafter the signal S1 changes at the time t4 in response to the signal E·/RD. In the data read mode and erase mode, the potential of the potential supply terminal VA is set to 0 V. When the signal E·R is a logic "1", the signals R1 to R4 are a logic "0" and the signals R1B to R4B are a logic "1".

The circuit for supplying the signal S1 as shown in FIG. 8 is basically the same as that shown in FIG. 6. However, the circuit shown in FIG. 8 is controlled by the signal E·/RD. Here, when the signal E·/RD is a logic "0", the signal S1 is set to a logic "0", irrespective of the address signals. For instance, in FIG. 1, when one of the memory cells related to the signal S1 is selected and the address signals change, the signal E·R changes to a logic "1"; the signals R1 to R4 are set to a logic "0"; and the signals R1B to R4B are set to a logic "1".

Thereafter, the signal E·R changes to a logic "0", and three predetermined non-selected signals of the four signals R1 to R4 changes to a logic "1". Thereafter, after the time t has elapsed, the signal E·/RD changes to a logic "1", and the signal S1 changes to the selected logic "1". The potential level of this logic "1" is the boosted voltage level.

In the circuits as shown in FIGS. 7 and 8, after the signals R1 to R4 and R1B to R4B have been outputted, the signal S1 is outputted. Therefore, the voltage boosted by using the capacitance 101 in FIG. 8 is transmitted to the row lines through the transistors 51 to 54 and 61 to 64 controlled by the signals R1 to R4 and R1B to R4B, so that it is possible to transmit the boosted potential to the row lines effectively.

Figure 10:
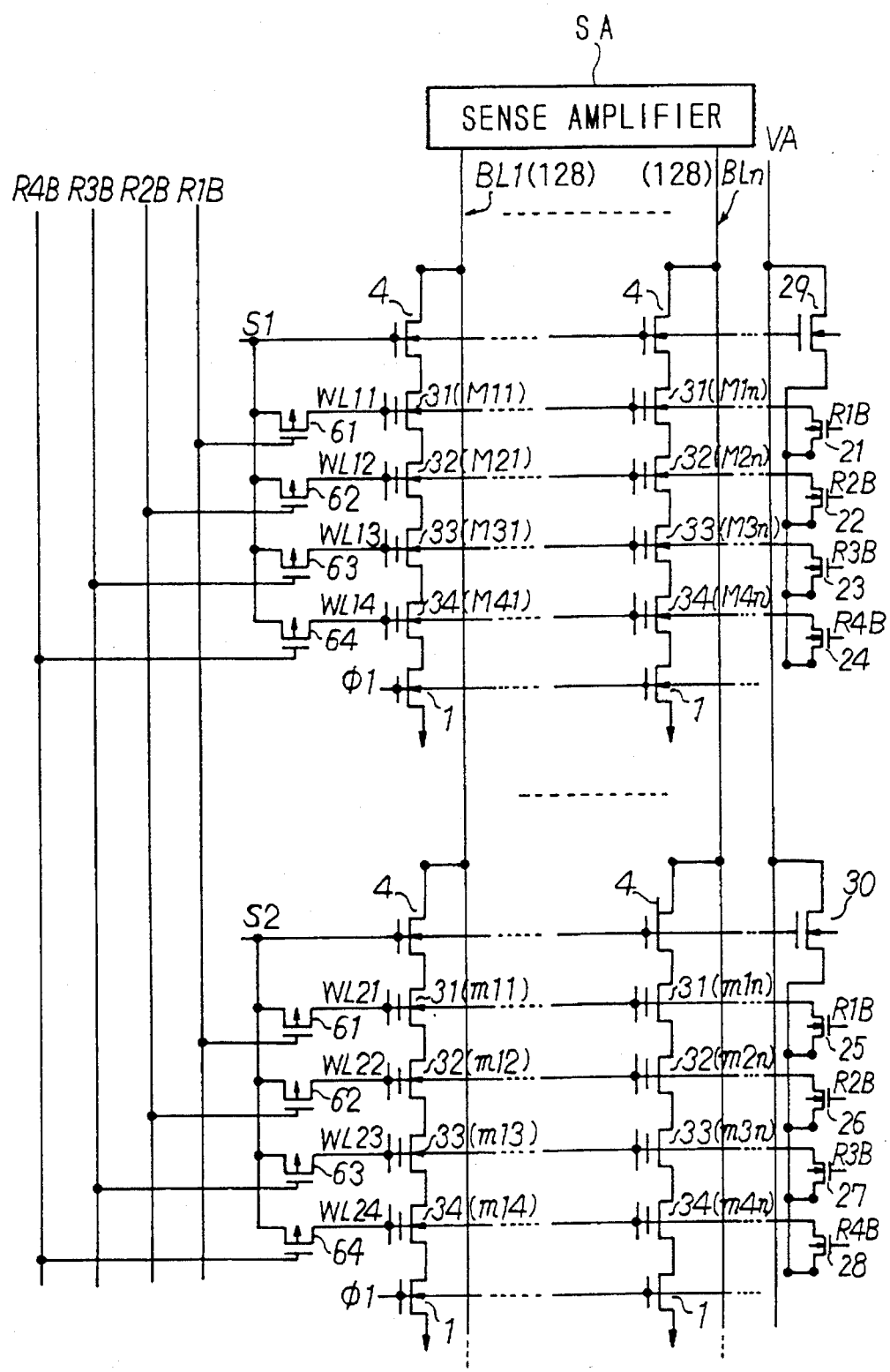
FIG. 10 is a circuit diagram showing a second embodiment of the semiconductor memory device according to the present invention.

FIG. 10 is a circuit diagram showing a second embodiment of the present invention. This second embodiment is different from the first embodiment shown in FIG. 1 in that the N-channel MOS transistors 51 to 54 are removed.

In the circuit configuration shown in FIG. 10, the row lines WL11 to WL14 and WL21 to WL24 are charged by the signals S1 and S2. Where the transistors 61 to 64 of the same size as in FIG. 1 are used, although the row line charge is delayed, there exists such an advantage that the number of the signal transmission lines and the number of the transistors can be both reduced half.

Figure 11:
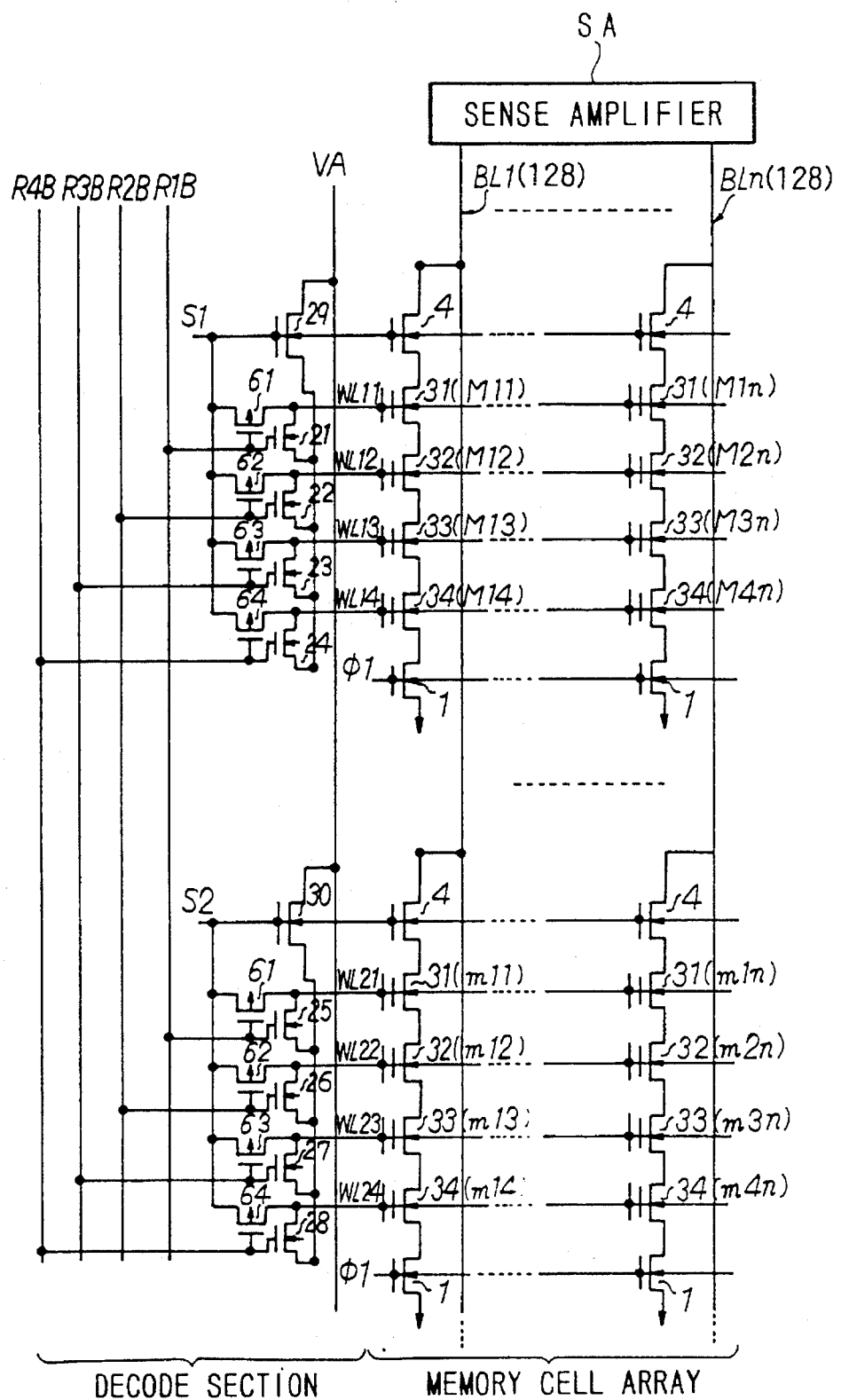
FIG. 11 is a circuit diagram showing a third embodiment of the semiconductor memory device according to the present invention.

FIG. 11 is a circuit diagram showing a third embodiment of the present invention. This third embodiment is different from the second embodiment shown in FIG. 10 in that the transistors 21 to 30 connected to the potential supply terminal VA are moved on the opposite side of the memory cell array in the vicinity of the transistors 61 to 64.

In the circuit shown in FIG. 11, the signals R1B to R4B are applied to the gates of the transistors 61 to 64 and the gates of the transistors 21 to 28. In this embodiment, there exists such an advantage that the lines of the signals R1B to R4B can be used in common and further the line length can be shortened.

Figure 12:
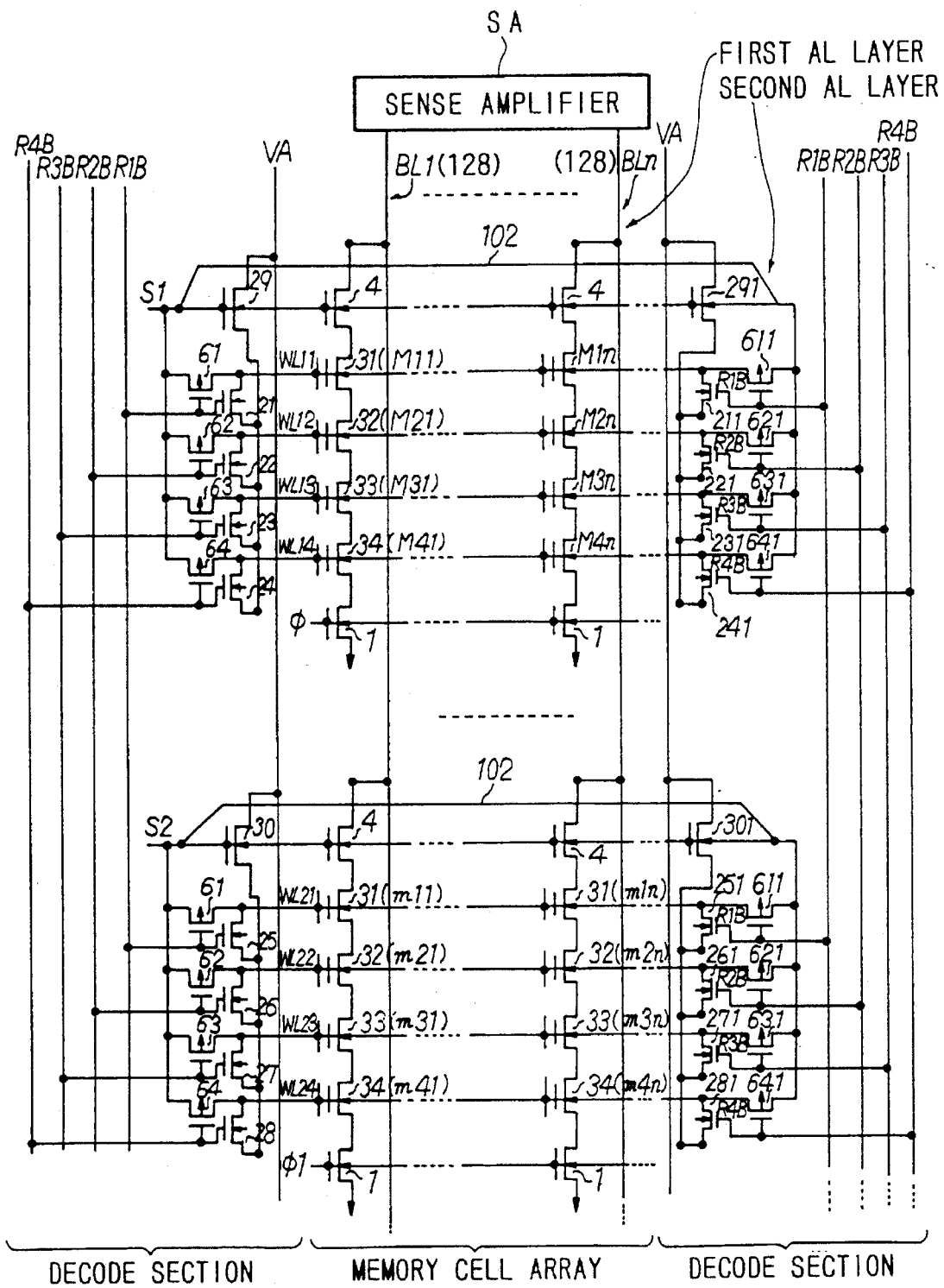
FIG. 12 is a circuit diagram showing a fourth embodiment of the semiconductor memory device according to the present invention.

FIG. 12 is a circuit diagram showing a fourth embodiment of the present invention. This fourth embodiment is different from the third embodiment shown in FIG. 11 in that transistors 611, 621, 631, 641, 211, 221, 231, 241, 251, 261, 271, and 281 having gates to which the signals R1B to R4B are inputted are further provided on the right side of the memory cell array so as to correspond to the signals S1, S2, . . . and the row lines WL11 to WL14, WL21 to WL24 and further transistors 291 and 301 connected to the potential supply terminal VA are arranged in the vicinity of the transistors 611 to 641. Further, in this circuit, the signals S1 and S2 are also transmitted also through a second aluminum wiring layer 102 arranged in a layer different from a first aluminum wiring layer of column lines 128. In other words, the decode circuits are connected to each other via the aluminum wire 102 and arranged on both sides of the memory cell array.

In general, since the row lines and the column lines are arranged so as to be perpendicular to one another, the row and column lines are formed on two different layers. Since the row lines are connected to the gates of the transistors, the row lines are formed by the poly silicon (the same material as the gate), and the row lines and the memory cell transistors are formed in common. In other words, the row lines of the gates of the memory cells 31 to 34 and the select transistor 4 are formed of poly silicon. On the other hand, the column lines 128 perpendicular to the row lines are formed of aluminum.

As is well known, the resistance value of poly silicon is larger than that of aluminum. Therefore, it takes a long time to charge at a predetermined potential the row lines. In other words, the resistance of the poly silicon is one of the major factors for delaying the data read speed.

In contrast with this, in FIG. 12, the delay of the charging speed of the row line due to the resistance of the poly silicon is reduced. That is, since the decoder sections are arranged on both sides of the memory cell array so that the row lines can be charged or discharged from both the sides of the memory cell array, it is possible to reduce the resistance of the row lines by half substantially, as compared with when the memory cell array is charged or discharged from the row lines arranged on one side of the memory cell array. Therefore, it is possible to increase the charge and discharge speed of the row lines.

Therefore, in this embodiment, in addition to the first aluminum wiring layer for forming the column lines 128, the second aluminum wiring layer 102 is arranged to transmit the signals S1, S2, . . . supplied from the left side of the memory cell array. As a result, since the signals S1, S2, . . . can be supplied to both the sides of the memory cell array roughly at the same time, it is possible to shorten the speed of charging and discharging the row lines.

Further, although the circuits for generating the signals S1, S2, . . . are arranged on one side of the memory cell array, since the other circuits are arranged on both sides of the memory cell array as shown in FIG. 2, the row lines WL11 to WL14 and WL21 to WL24 are charged and discharged from both sides of the memory cell array, thus reducing the charging and discharging time to improve the data read speed.

Of course, in the circuit shown in FIG. 12, it may be possible to arrange the circuits for generating the signals S1, S2, . . . on both sides of the memory cell array. In this case, however, there exists a problem in that the occupation area of the circuit is increased. In this case, however, since second aluminum wiring layer 102 is not needed, there exists such an advantage that the manufacturing process can be simplified.

As described above, in the above-mentioned embodiment, there exists such an advantage that the number of the elements for constituting the decode circuit can be reduced so that the cost of the memory device can be reduced. In addition, since both sides of the memory cell array are connected to one another by the second aluminum wiring layer 102, the row lines can be charged and discharged at high speed, so that there exists such an advantage that the high data read speed can be gotten. Further, since the memory cells 31 to 34 are driven by the signals for driving the select transistor 4, the select transistor 4 and the plural memory cells 31 to 34 connected in series with the select transistor 4 can be connected to one another via one second aluminum wiring layer 102. Therefore, it is possible to widen the space between the two adjacent second aluminum wiring layers 102 arranged in the row line direction, so that the manufacturing process can be facilitated.

Figure 13:
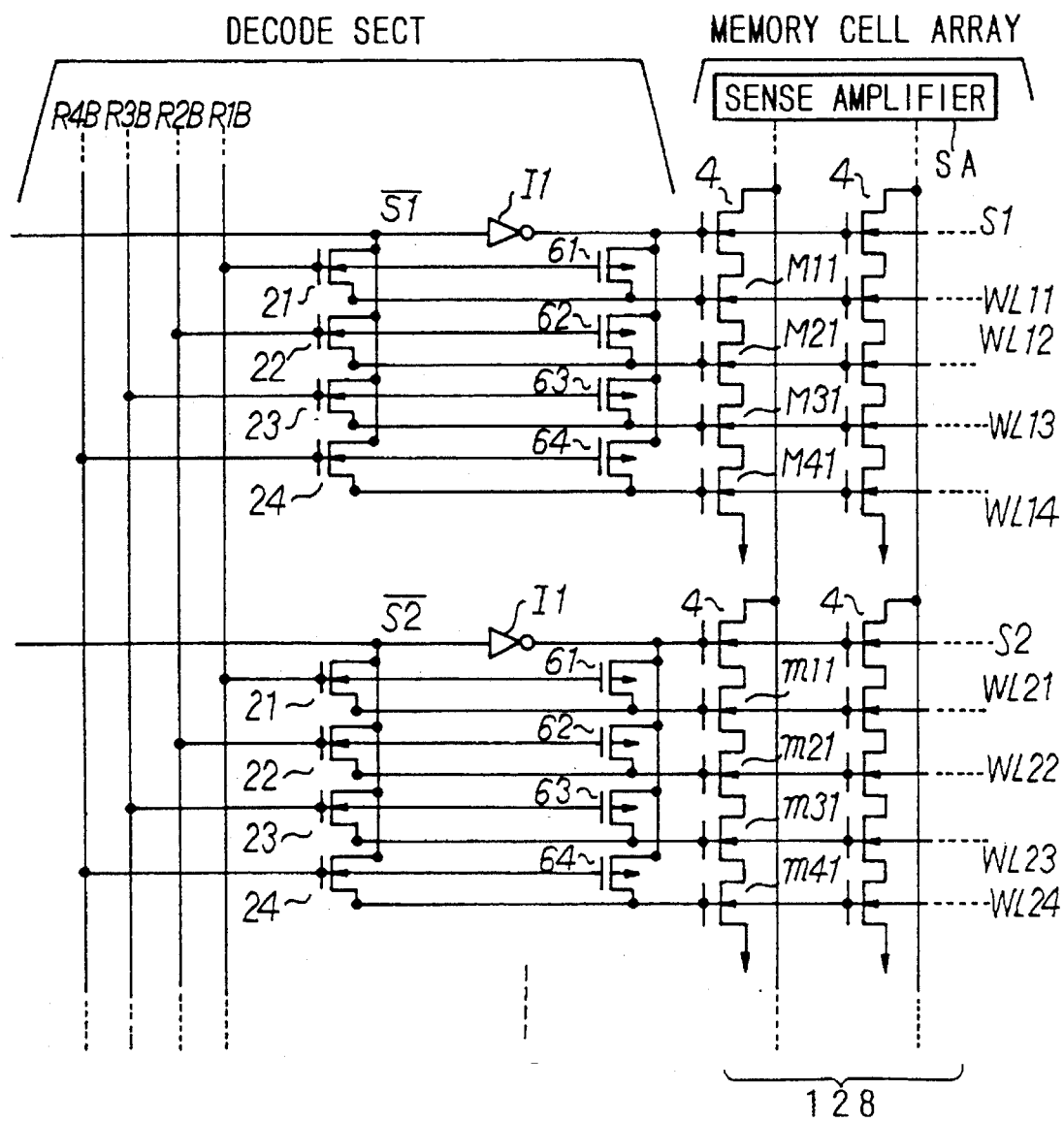
FIG. 13 is a circuit diagram showing a fifth embodiment of the semiconductor memory device according to the present invention.
Figure 14:
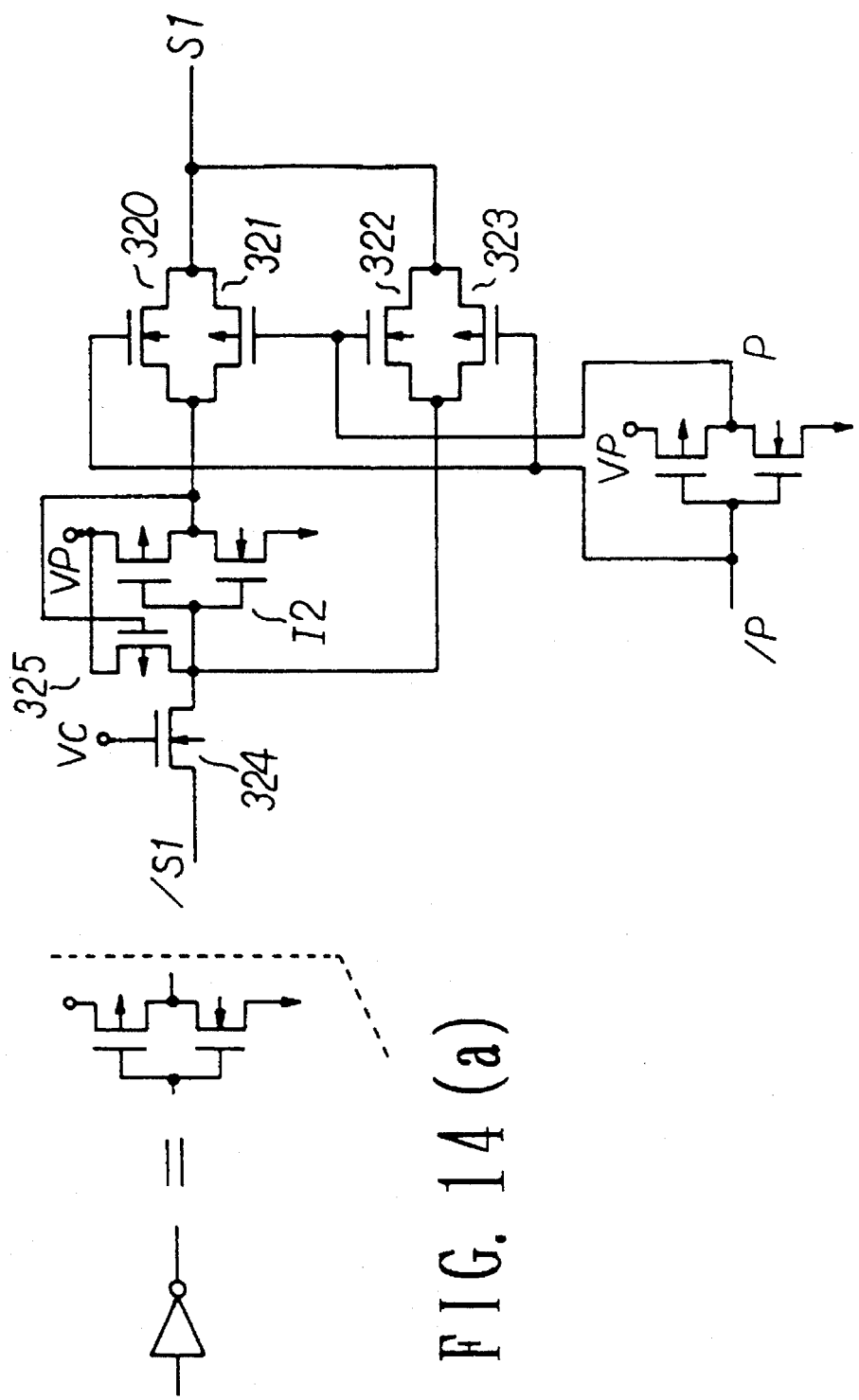
FIGS. 14(a) and 14(b) are circuit diagrams showing an inverter and another circuit substituted therefor.

The decode circuit constructed as above can be of course used for ROMs, without being limited to only the NAND type EEPROM. In a mask ROM whose memory cell section is of NAND structure, the current cut-off transistor 1 is unnecessary. FIG. 13 shows a fifth embodiment in which the present invention is applied to the mask ROM. The fifth embodiment is different from the third embodiment shown in FIG. 11 in that the memory cells are replaced with memory cells for the mask ROM; the potential supply terminal VA and the transistors 29 and 30 are removed; and the signals /S1 or /S2 are supplied instead of the VA which is supplied to the transistors 21 to 28 via the transistors 29 and 30. As shown in FIG. 13, the signal S1 or S2 can be obtained by inverting the signal /S1 or /S2 inputted to the inverter I1. As the inverter I1, it is possible to use an ordinary CMOS inverter composed of a P-channel and an N-channel transistors as shown in FIG. 14(a).

The operation of when the second row line WL11 is selected and data are read from the memory cell M11 will be explained hereinbelow. The selected first row line; that is, the signal S1 is set to a logic "1" and the non-selected first row line; that is, the signal S2 is set to a logic "0". Further, the signal R1B is set to a logic "1" and the other signals R2B, R3B and R4B are set to a logic "0". Consequently, the transistors 22, 23 and 24 and the transistor 61 are turned off and the transistors 21, 62, 63 and 64 are turned on. Accordingly, since the signal /S1 of a logic "0" is applied to the row line WL11 through the transistor 21, the WL11 is set to a logic "0". On the other hand, since the signal S1 is applied to the row lines WL12, WL13 and WL14 through the transistors 62 to 64, these row lines are set to a logic "1". As described above, with respect to the block including the selected memory cell, the selected second row line WL11 is set to a logic "0" and the non-selected second row lines WL12 to WL14 are set to a logic "1". In the fifth embodiment, this logic "1" is given by the signal S1 for controlling the select transistor 4. With respect to the block not including the selected memory cell, since the signal S2, for instance is a logic "0", the select transistor 4 to which the signal S2 is applied is turned off. Therefore, there exists no problem even if the potentials of the second row lines WL21, WL22, WL23 and WL24 related to this signal S2 is at any level.

In the above-mentioned embodiments, the memory cells connected to the select transistors 4 are all connected in series. However, in the case where a plurality of the memory cells connected to the select transistor are connected in parallel to one another, the second row line of the memory cell must be set to a logic "1" when the second row line is selected and to a logic "0" when the second row line is not selected. In this case, the logic levels of the signals R1B, R2B, R3B and R4B are all inverted. For instance, when the second row line WL11 is selected, the signal S1 is set to a logic "1"; the signal S2 is set to a logic "0"; the signal R1B is set to a logic "0"; and the signals R2B, R3B and R4B are set to a logic "1", respectively.

Figure 15:
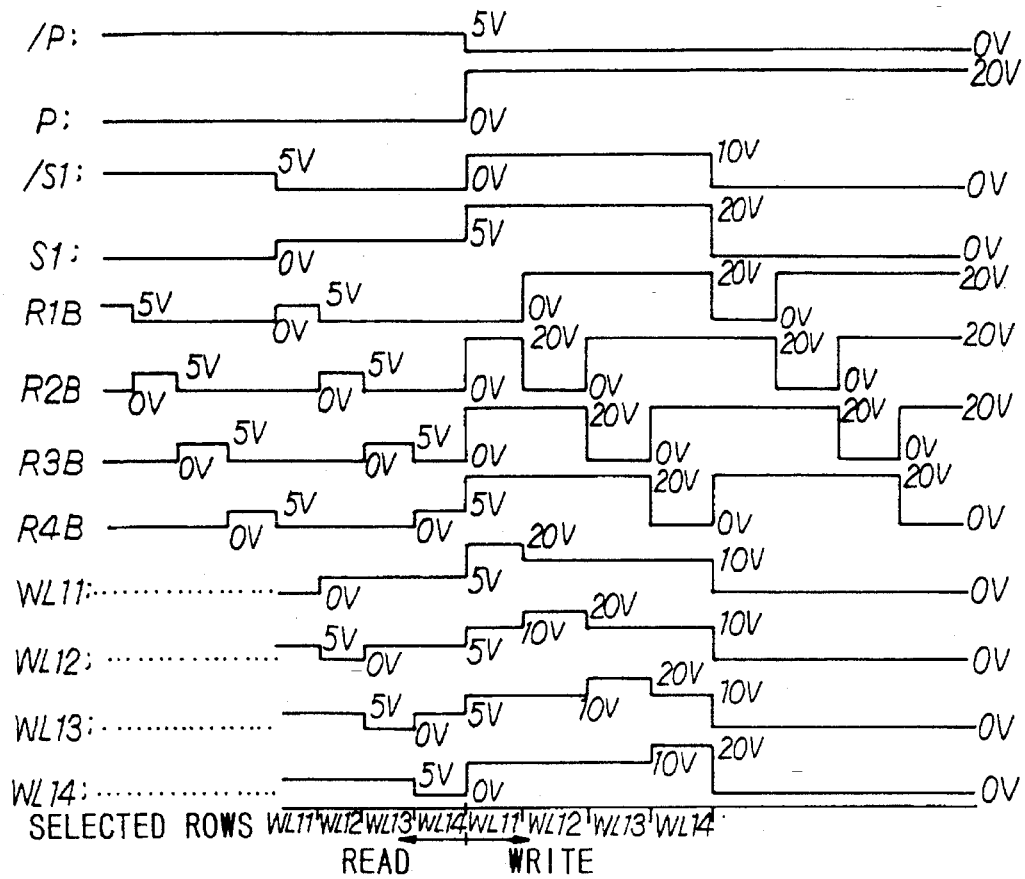
FIG. 15 is a timing chart showing the voltage waveforms at the essential nodes of the circuit shown in FIG. 13.
Figure 16:
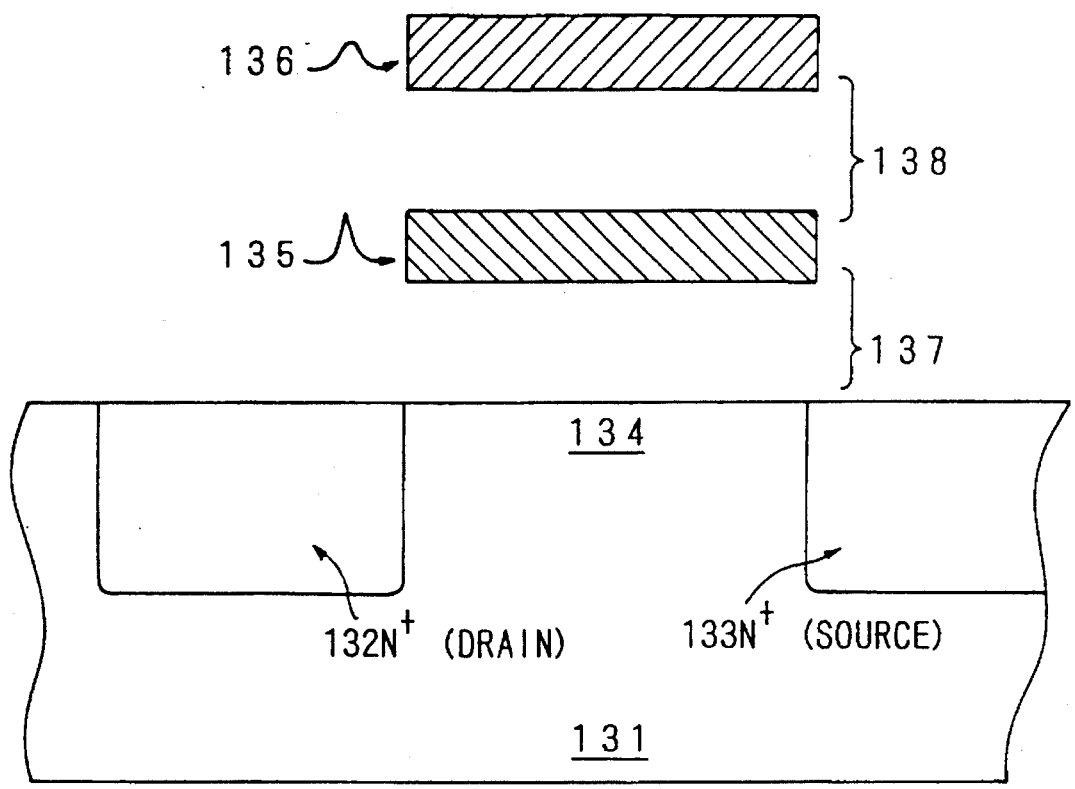
FIG. 16 is a cross-sectional view showing a MOS transistor having a floating gate.
Figure 17:
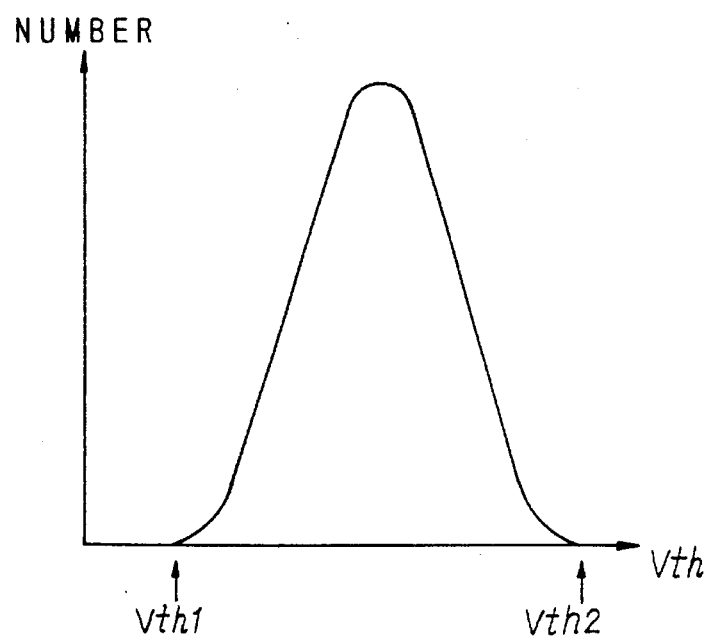
FIG. 17 is a graphical representation showing a threshold voltage distribution of the memory cells.
Figure 18:
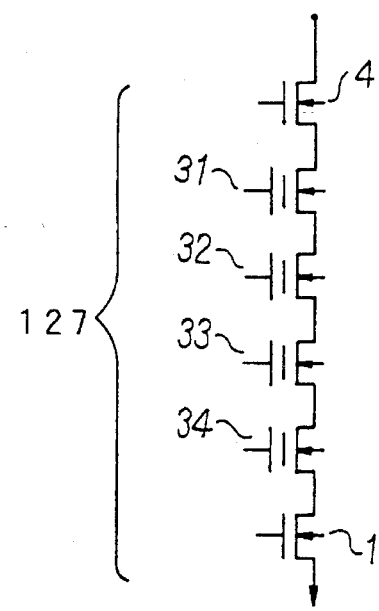
FIG. 18 is a circuit diagram showing a memory cell block of the general semiconductor memory device.
Figure 19:
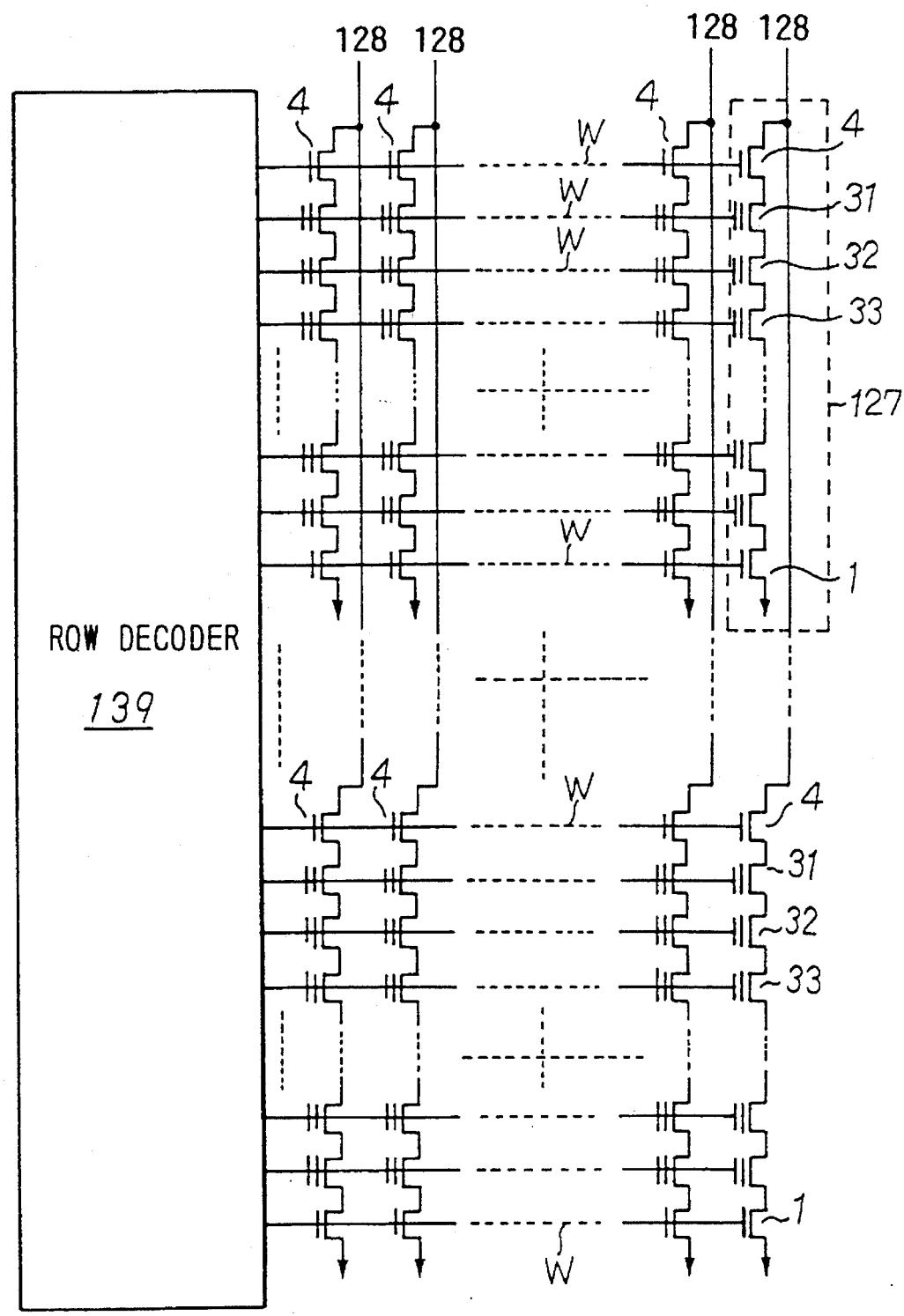
FIG. 19 is a block diagram showing a general NAND type EEPROM.

Further, in the case of the above-mentioned NAND type EEPROM in which the memory cells are of MOS transistors each having a floating gate and data are stored by injecting electrons into the floating gates, when electrons are injected into the floating gates for programming data, a high voltage must be applied to the control gates thereof. In this case, instead of the inverter I1 shown in FIG. 13; that is, the inverter as shown in FIG. 14(a), it is preferable to use the circuit as shown in FIG. 14(b). FIG. 15 shows the waveforms at the essential nodes of the circuit shown in FIG. 14(b). As shown in FIG. 15, the signals /P and P are set to a logic "0" and "1", respectively when electrons are injected into the floating gates; and to a logic "1" and "0" respectively, when data are read. Since the signals /P and P are a logic "1" and "0", respectively when data are read, N-channel transistor 320 and P-channel transistor 321 are turned on and N-channel transistor 322 and P-channel transistor 323 are turned off, so that the signal /S1 is inverted by inverter I2 and outputted as the signal S1 through the transistors 320 and 321. Further, since the signals /P and P are set to the logic "0" and "1", respectively where electrons are injected into the floating gates, when data are written by injecting electrons into the floating gates of the memory cells, the transistors 320 and 321 are turned off and the transistors 322 and 323 are turned on. Accordingly, the signal /S1 is outputted as the signal S1 through the transistors 322 and 323. In this case, the signals /S1 and S1 are in phase with each other in the data write mode. As already explained with reference to FIG. 1, in the data write mode, the control gate of the selected memory cell is set to a logic "1", so that a high voltage of about 20 V, for instance is supplied to the control gate. In this case, when electrons are required to be injected into the floating gate, the channel region of the memory cell is set to 0 V. Electrons are injected from the channel region to the floating gate through a gate insulating film. When electrons are not required to be injected, a predetermined voltage (e.g., about 10 V) is supplied to the channel region through the select transistor. In this case, even if the control gate is set to 20 V, since the channel region is set to 10 V, the potential difference between the floating gate and the channel region of the memory cell is not enough large to inject electrons into the floating gate, so that the floating gate is kept in the erase state. Although a high voltage of about 20 V is applied to the control gate of the selected memory cell, since the control gate of the non-selected memory cell is set to a voltage of about 10 V, even if the channel region of the non-selected memory cell is at 0 V, the potential difference between the floating gate and the channel region is not large as to inject electrons into the floating gates. In the data write mode, when the signal S1 is selected, the signal /S1 is set to about 10 V. The signal /S1 is supplied to the gate of the inverter I2 through the transistor 324. Since the gate of the transistor 324 is connected to VC (e.g., 5 V), this transistor 324 is turned off. Consequently, since the output of the inverter I2 responsive to the signal /S1 applied through the transistor 324 is set to 0 V, the input terminal of the inverter I2 is charged to the high potential VP (e.g., 20 V) by the P-channel transistor 325, so that the signal S1 is set to the high voltage of 20 V through the transistors 322 and 323. Here, the voltage VC is a low voltage of about 5 V. The voltage VP is set to the high voltage of about 20 V when data are programmed and to the voltage of 5 V when the data are read. In the data write mode, when the second row line WL11 is selected, the signal R1B is set to 0 V, and the other signals R2B, R3B and R4B are set to the high voltage of about 20 V. Under these conditions, since the transistor 21 is turned off and the transistor 61 is turned on in FIG. 13, the second row line WL11 is connected to the signal S1 via the transistor 61, so that the high voltage of about 20 V is supplied. On the other hand, since the transistors 22, 23 and 24 are turned on and the transistors 62, 63 and 64 are turned off, the potential of the signal /S1 is supplied to the second non-selected row lines WL12, WL13 and WL14. Here, if the signal /S1 is set to about 10 V about 10 V is supplied to the second non-selected row lines.

When the signal S1 is at a non-select state, the signal /S1 is set to 0 V. In this case, the signal S1 is discharged to the signal /S1 through the transistors 322, 323 and 324, so that the signal S1 is at the same level (0 V) of the signal /S1. When the signal R1B is set to 0 V and the other signals R2B, R3B and R4B are set to the high voltage of about 20 V, since the transistor 21 is turned off and the transistor 61 is turned on, the second row line WL11 is connected to the signal S1 through the transistor 61, so that the second row line is discharged toward the signal S1. This discharge stops when the voltage of the second row line WL11 at the threshold voltage of the P-channel transistor 61. On the other hand, since the transistors 22, 23 and 24 are turned on and the transistors 62, 63 and 64 are turned off, the potential of the signal /S1 is supplied to the second non-selected row lines WL12, WL13 and WL14; that is 0 V is supplied thereto.

As described above, in the embodiment according to the present invention, in the case of the mask ROM, since the decode circuit for selecting the memory cells can be constructed simply, there exists such an advantage that the decode circuit of small occupation area can be provided.

As described above, in the semiconductor memory device according to the present invention, since the control gates of the memory cells are controlled by transmitting the signals for controlling the select transistors of the memory cells through the row lines, even when the control gates of the memory cells are controlled by the boosted voltage to read data, it is possible to reduce the capacitance to be charged and thereby to shorten the boosted voltage supply time, so that the data read speed can be improved.

What is claimed is:

1. A semiconductor memory device, comprising:

first row lines;

selecting transistors driven by said first row lines;

second row lines;

memory cells driven by said second row lines and connected in series with said selecting transistors;

first selecting means for selecting said first row lines;

second selecting means for selecting said second row lines;

column lines connected to said selecting transistors;

data detecting means connected to said column lines, for detecting data stored in said memory cells;

first switching means connected between said first selecting means and said second row lines, for selecting said second row lines in response to said second selecting means; and second switching means connected between a potential supply terminal for supplying a predetermined potential and said second row lines, for selecting said second row lines in response to said second selecting means.

2. A semiconductor memory device, comprising:

a first row line;

selecting transistors connected to said first row line;

second row lines;

memory cell blocks each including memory cells, each of said memory cell blocks connected to one of said selecting transistors, each of said memory cells of each of said memory cell blocks being connected to a corresponding one of said second row lines;

first selecting means for selecting said first row line and for selecting at least one of said second row lines;

second selecting means for selecting one of said second row lines; and switching means controlled by signals from said second selecting means to select said one of said second row lines, and connected between said first selecting means and said second row lines for selecting a one of said memory cells in response to signals from said second selecting means, wherein a signal generated by said first selecting means is applied to said memory cell through said switching means and said second row line.

3. A semiconductor memory device, comprising:

a memory array formed by arranging a plurality of memory blocks into a matrix pattern of rows and columns, each of the rows and columns having first and second lines, each memory block comprising a select transistor and a plurality of memory cells connected to the select transistor each of the select transistors having a gate, each of the memory cells having a gate, the gates of the select transistors in the same row being connected in common to one of the first row lines the gates of the memory cells in the same row being connected in common to one of the second row lines;

first selecting means for selecting one of said first row lines;

second selecting means for selecting one of said second row lines;

a plurality of switching means having one end connected in common to said first selecting means and the other end connected to a corresponding one of said second row lines, and signal lines to which signals from said second selecting means are supplied, the signal lines being connected to corresponding ones of said plurality of switching means, wherein said plurality of switching means are controlled by the signals from said second selecting means, and a memory cell is selected by a signal which is applied from said first selecting means through said switching means in response to the signals from said second selecting means.

4. The semiconductor memory device of claim 3, wherein both ends of each of said first row lines are connected through a wiring layer different from said first row lines.

5. A semiconductor memory device comprising:

a plurality of memory cell blocks arranged in matrix array of rows and columns, each of the rows having first and second rows, each memory cell block being constituted between a first terminal and a second terminal by memory cells and a select transistor for selecting the memory cell block, each of the memory cells having a gate, the select transistor having a gate, the first terminals of the memory cel blocks in the same column being commonly connected, the gates of the select transistors in the same row being commonly connected and forming the first row, and the gates of the memory cells in the same row being commonly connected and forming the second row;

first row selection means for designating the first row; and second row selection means for designating one of the second rows, including decoding means and a plurality of first switching means, each of the first switching means having a first end and a second end, the first end of the first switching means being coupled to the first row selection means, the second end of the first switching means being coupled to the second row, a signal supplied from the decoding means controlling the first switching means, wherein a signal supplied from the first row selection means is applied to the second row through the first switching means in response to the signal from the decoding means.

6. A semiconductor memory device according to claim 5, wherein the second row selection means includes a plurality of second switching means, the second switching means is connected between the second row and a predetermined potential, and the second switching means is controlled by a signal supplied from the decoding means.

7. A semiconductor memory device comprising:

a plurality of memory cell blocks arranged in matrix array of rows and columns, each of the rows having first and second rows, each memory cell block being constituted between a first terminal and a second terminal by memory cells and a select transistor for selecting the memory cell block, each of the memory cells having a gate, the select transistor having a gate, the first terminals of the memory cell blocks in the same column being commonly connected, the gates of the select transistors in the same row being commonly connected and forming the first row, and the gates of the memory cells in the same row being commonly connected and forming the second row; and row selection means including first row selection means for designating the first row and second row selection means for designating of the second row, wherein the first row selection means is coupled to the second row selection means, a signal supplied from the first row selection means is supplied to the second row in response to a signal supplied from the second row selection means for selecting the second row.

8. A semiconductor memory device comprising:

a plurality of memory cell blocks arranged in matrix array of rows and columns, each of the rows having first and second rows, each memory cell block being constituted between a first terminal and a second terminal by memory cells and a select transistor for selecting the memory cell block, each of the memory cells having a gate, the select transistor having a gate, the first terminals of the memory cell blocks in the same column being commonly connected, the gates of the select transistors in the same row being commonly connected and forming the first row, and the gates of the memory cells in the same row being commonly connected and forming the second row;

row selecting means generating a first signal and a second signal for designating one of the first rows and one of the second rows in response to a row selection signal, wherein the first signal is applied to the first row; and switching means connected between the row selecting means and the second row, the switching means receiving the first signal and being controlled by the second signal, for controlling a potential level of the second row for designating the memory cell in response to the first and the second signals from the row selecting means, wherein the potential level of the second row is controlled by the first signal supplied through the switching means.

9. A semiconductor memory device comprising:

a plurality of memory cell blocks arranged in matrix array of rows and columns, each of the rows having first and second rows, each memory cell block being constituted between a first terminal and a second terminal by memory cells and a select transistor for selecting the memory cell block, each of the memory cells having a gate, the select transistor having a gate, the first terminals of the memory cell blocks in the same column being commonly connected, the gates of the select transistors in the same row being commonly connected and forming the first row, and the gates of the memory cells in the same row being commonly connected and forming the second row;

row selecting means generating a first signal and a second signal for designating one of the first rows and one of the second rows in response to a row selection signal, wherein the first signal is applied to the first row; and switching means connected between the row selecting means and the second row, the switching means receiving the first signal and being controlled by the second signal, for controlling the second row for selecting a memory cell, wherein the memory cell is controlled by the first signal supplied through the switching means.

* * * * *